US012573462B2

(12) United States Patent
Zhu

(10) Patent No.: US 12,573,462 B2
(45) Date of Patent: Mar. 10, 2026

(54) MEMORY DEVICE, MEMORY SYSTEM AND OPERATION METHOD THEREOF

(71) Applicant: YANGTZE MEMORY TECHNOLOGIES CO., LTD., Wuhan (CN)

(72) Inventor: Zhijiu Zhu, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 148 days.

(21) Appl. No.: 18/403,471

(22) Filed: Jan. 3, 2024

(65) Prior Publication Data

US 2025/0104782 A1     Mar. 27, 2025

(30) Foreign Application Priority Data

Sep. 26, 2023    (CN) .......................... 202311255287.8

(51) Int. Cl.
*G11C 16/34*       (2006.01)
*G11C 16/10*       (2006.01)
*G11C 16/26*       (2006.01)

(52) U.S. Cl.
CPC ........ *G11C 16/3459* (2013.01); *G11C 16/102* (2013.01); *G11C 16/26* (2013.01)

(58) Field of Classification Search
CPC ... G11C 16/3459; G11C 16/102; G11C 16/26; G11C 16/0483; G11C 16/10
See application file for complete search history.

(56) References Cited

U.S. PATENT DOCUMENTS

| | | | | |
|---|---|---|---|---|
| 2010/0309725 A1* | 12/2010 | Huh | ....................... | G11C 16/06 |
| | | | | 365/185.12 |
| 2020/0349985 A1 | 11/2020 | Cho et al. | | |
| 2022/0189517 A1* | 6/2022 | Lee | ........................ | G11C 16/26 |
| 2023/0060080 A1* | 2/2023 | Cho | ........................ | G11C 16/10 |

FOREIGN PATENT DOCUMENTS

| | | |
|---|---|---|
| CN | 110610736 A | 12/2019 |
| CN | 112542186 A | 3/2021 |
| KR | 20060060386 A | 6/2006 |

OTHER PUBLICATIONS

Yangtze Memory Technologies Co., Ltd., "First Examination Opinion Notice," dated Aug. 28, 2025, CN App. No. 202311255287.8, 7 p. (plus 7 p. translation).

* cited by examiner

*Primary Examiner* — Uyen Smet
(74) *Attorney, Agent, or Firm* — Conley Rose, P.C.

(57)        ABSTRACT

The present application discloses a memory device, a memory system and an operation method, wherein the memory device includes a memory array including a plurality of memory cells; and a peripheral circuit coupled with the memory array and including a plurality of page buffers; each page buffer includes at least two groups of latch circuits; each group of latch circuits includes a first latch sub-circuit and a second latch sub-circuit; the first latch sub-circuit is coupled with a sensing node and configured to latch first information on the sensing node; and the second latch sub-circuit is coupled with the sensing node and configured to latch second information on the sensing node through the first latch sub-circuit, wherein the first information in the first latch sub-circuit and the second information in the second latch sub-circuit are switched through the sensing node.

20 Claims, 12 Drawing Sheets

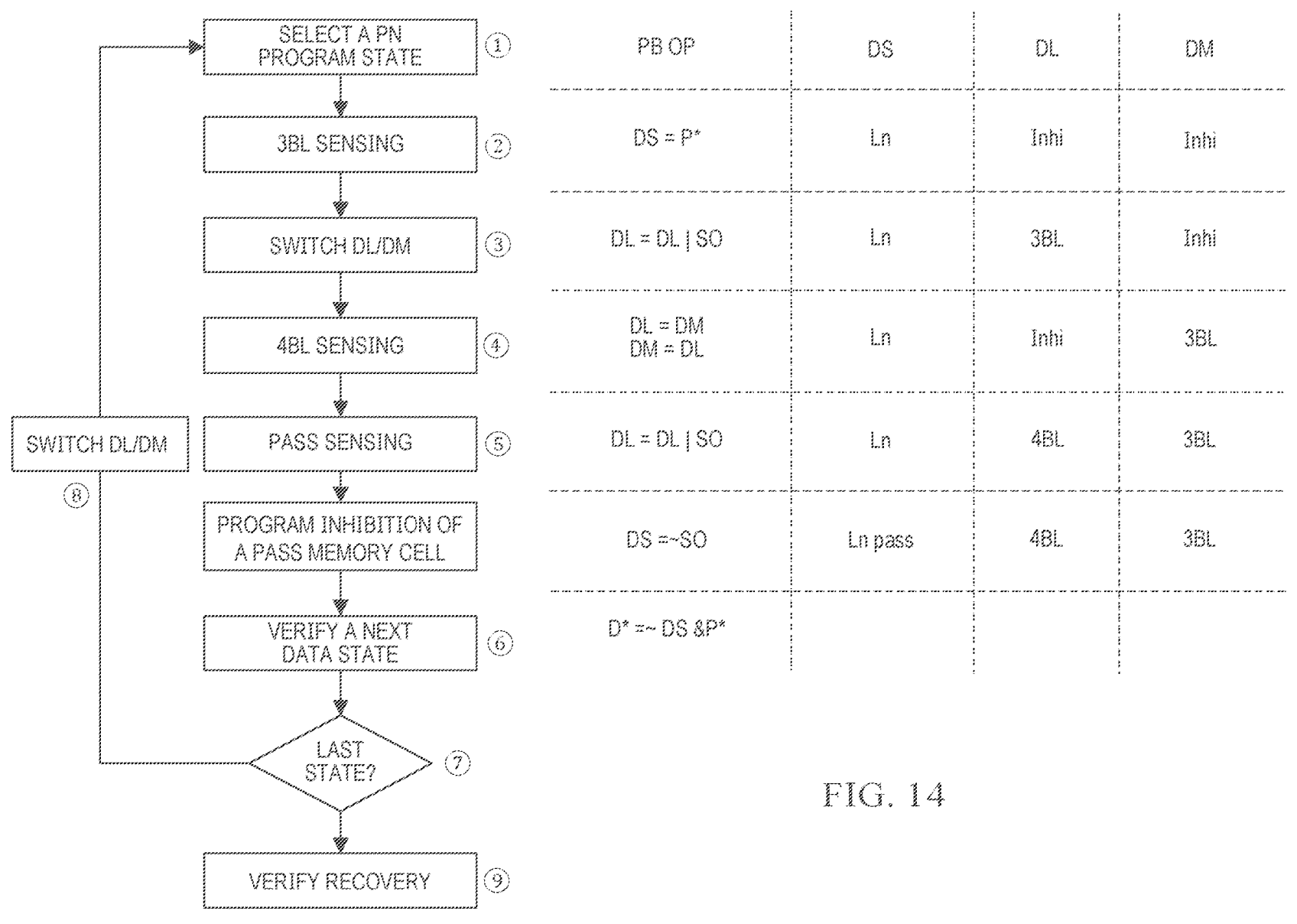

| PB OP | DS | DL | DM |
|---|---|---|---|
| DS = P* | Ln | Inhi | Inhi |
| DL = DL | SO | Ln | 3BL | Inhi |
| DL = DM<br>DM = DL | Ln | Inhi | 3BL |
| DL = DL | SO | Ln | 4BL | 3BL |
| DS =~SO | Ln pass | 4BL | 3BL |
| D* =~ DS &P* | | | |

FIG. 14

① SELECT A PN PROGRAM STATE

② 3BL SENSING

③ SWITCH DL/DM

④ 4BL SENSING

⑤ PASS SENSING

PROGRAM INHIBITION OF A PASS MEMORY CELL

⑥ VERIFY A NEXT DATA STATE

⑦ LAST STATE?

⑧ SWITCH DL/DM

⑨ VERIFY RECOVERY

MEMORY DEVICE, MEMORY SYSTEM AND OPERATION METHOD THEREOF

CROSS-REFERENCE TO RELATED APPLICATIONS

The present application claims priority to Chinese Patent Application No. 2023112552878, which was filed Sep. 26, 2023, is titled "A MEMORY DEVICE, SYSTEM AND OPERATING METHOD THEREOF," and is hereby incorporated herein by reference in its entirety.

TECHNICAL FIELD

The present application relates to the field of semiconductor technologies, and particularly to a memory device, a memory system and an operation method thereof.

BACKGROUND

As the storage density of a 3D NAND flash memory device increases, a large number of page buffers are used in the 3D NAND flash memory device. These page buffers occupy a large area in a peripheral circuit of the memory device.

SUMMARY

In view of this, examples of the present application provide a memory device, a memory system and an operation method.

In a first aspect, examples of the present application provide a memory device, comprising:

a memory array comprising a plurality of memory cells; and a peripheral circuit coupled with the memory array and comprising a plurality of page buffers, each page buffer comprising at least two groups of latch circuits, and each group of latch circuits comprising a first latch sub-circuit and a second latch sub-circuit, wherein the first latch sub-circuit is coupled with a sensing node and configured to latch first information on the sensing node; and the second latch sub-circuit is coupled with the sensing node and configured to latch second information on the sensing node through the first latch sub-circuit;

wherein the first information in the first latch sub-circuit and the second information in the second latch sub-circuit are switched through the sensing node.

In the above solution, each group of latch circuits further comprises a pass control switch, wherein the pass control switch connects the first latch sub-circuit with the second latch sub-circuit, and is configured to be in a turned-on state to pass the first information stored in the first latch sub-circuit to the second latch sub-circuit in response to a pass control signal.

In the above solution, the second latch sub-circuit comprises: a parasitic capacitor for storing the second information, wherein the parasitic capacitor is connected with an end of the pass control switch away from the first latch sub-circuit.

In the above solution, the at least two groups of latch circuits are configured to store to-be-written data or read data.

In the above solution, one group of the at least two groups of latch circuits is configured to store intermediate data in a program process or verify data in a verify process; and other groups of the at least two groups of latch circuits are configured to store to-be-written data or read data.

In the above solution, the first latch sub-circuit comprises a set switch and a storage element, wherein the set switch is coupled with the sensing node and connected with the storage element, and is configured to latch the first information on the sensing node to the storage element in response to a set signal.

In the above solution, the first latch sub-circuit further comprises a reset switch that is connected with the storage element, and configured to reset the storage element in response to a reset signal.

In the above solution, the first latch sub-circuit further comprises a sensing control switch with one end connected to the set switch and the reset switch, and with the other end being grounded; and the sensing control switch is configured to be turned on under a voltage level of the sensing node and write the first information of the sensing node to the storage element through the set switch.

In the above solution, the first latch sub-circuit further comprises a reset control switch with one end connected to the set switch and the reset switch, and with the other end being grounded; and the reset control switch is further configured to reset the first latch sub-circuit through the reset switch in response to a reset control signal, wherein the reset control signal is generated by control of a control logic included in the peripheral circuit.

In the above solution, the storage element comprises a first phase inverter and a second phase inverter, wherein an input end of the first phase inverter is connected with an output end of the second phase inverter to form a first node; an output end of the first phase inverter is connected with an input end of the second phase inverter to form a second node; and the second node is connected with the second latch sub-circuit, and is configured to store the first information.

In the above solution, the set switch comprises a first transistor with one end connected to the first node; and the reset switch comprises a second transistor with one end connected to the second node, wherein the other end of the first transistor is connected with the other end of the second transistor.

In the above solution, each group of latch circuits further comprises a first control switch and a second control switch that are connected in series between the sensing node and ground, the first control switch is controlled by the second information latched by the second latch sub-circuit, and the second control switch is controlled by a read control signal, wherein when the second information controls the first control switch to be turned on and the read control signal controls the second control switch to be turned on, the second information is read to the sensing node.

In the above solution, the pass control switch comprises: a pass gate of a single MOS transistor structure or a pass gate of a double MOS transistor structure, wherein the double MOS transistor structure comprises a CMOS pass gate formed by connecting a PMOS transistor and an NMOS transistor in parallel.

In the above solution, the page buffer further comprises: a main latch circuit coupled with the sensing node and configured to store intermediate data in a program process or verify data in a verify process, wherein a structure of the main latch circuit is the same as a structure of the first latch sub-circuit; or a structure of the main latch circuit is the same as a structure of the first latch sub-circuit, except that the main latch circuit and the first latch sub-circuit share the sensing control switch and the reset control switch.

In the above solution, the at least two groups of latch circuits comprise: two groups of latch circuits that are configured to store Low Page (LP) data, Middle Page (MP) data, Up Page (UP) data and Extra Page (XP) data of to-be-written data or read data.

In the above solution, the at least two groups of latch circuits comprise: three groups of latch circuits, wherein two groups of latch circuits are configured to store Low Page (LP) data, Middle Page (MP) data, Up Page (UP) data and Extra Page (XP) data of to-be-written data or read data; and the remaining group of latch circuits is configured to store intermediate data in a program process or verify data in a verify process.

In a second aspect, examples of the present application further provide an operation method of a memory device. The memory device comprises a page buffer; the page buffer comprises at least two groups of latch circuits; each group of latch circuits comprises a first latch sub-circuit and a second latch sub-circuit that are interdependent and coupled with a sensing node; and the operation method comprises:

reading second information latched in the second latch sub-circuit to the sensing node when selecting a to-be-operated data state of a program operation or a verify operation of the memory device;

storing the second information of the sensing node to a sensing latch circuit of the page buffer;

switching the second information in the second latch sub-circuit with first information latched by the first latch sub-circuit; and reading the first information from the second latch sub-circuit to the sensing node, reading the second information from the sensing latch circuit to the sensing node, and obtaining selected information for indicating the to-be-operated data state.

In the above solution, the sensing latch circuit comprises a first sensing latch circuit and a second sensing latch circuit; the to-be-operated data state comprises a to-be-programmed data state or a to-be-verified data state; and the storing the second information of the sensing node to the sensing latch circuit included in the page buffer comprises:

storing the second information of the sensing node in the second sensing latch circuit when selecting the to-be-programmed data state corresponding to the program operation of the memory device, wherein first verify information stored by the second sensing latch circuit is invalid; and storing the second information of the sensing node in the first sensing latch circuit when selecting the to-be-verified data state corresponding to the verify operation of the memory device, wherein second verify information stored by the first sensing latch circuit is invalid, wherein the first verify information and the second verify information are generated when a previous verify operation is performed on the memory device.

In the above solution, the switching the second information in the second latch sub-circuit with the first information latched by the first latch sub-circuit comprises:

charging the sensing node such that a voltage level of the sensing node reaches a preset threshold value, so as to read the second information to the sensing node;

closing a pass channel between the first latch sub-circuit and the second latch sub-circuit for passing the first information to the second latch sub-circuit, in response to a pass control signal;

performing a clear operation on the first latch sub-circuit such that the first latch sub-circuit is recovered to an initial state; and writing the second information into the first latch sub-circuit.

In the above solution, the operation method further comprises:

writing the second information into the first latch sub-circuit when the second information is written into the second latch sub-circuit in the program operation or the verify operation of the memory device; and switching the first latch sub-circuit with the second latch sub-circuit, such that the second information is stored to the second latch sub-circuit.

In a third aspect, examples of the present application further provide a memory system, comprising: one or more memory devices described above, and a memory controller coupled with the memory devices and configured to control the memory devices.

Examples of the present application provide a memory device, a memory system and an operation method. Here, the memory device comprises a memory array comprising a plurality of memory cells; and a peripheral circuit coupled with the memory array and comprising a plurality of page buffers; each page buffer comprises at least two groups of latch circuits; each group of latch circuits comprises a first latch sub-circuit and a second latch sub-circuit, wherein the first latch sub-circuit is coupled with a sensing node and configured to latch first information on the sensing node; and the second latch sub-circuit is coupled with the sensing node and configured to latch second information on the sensing node through the first latch sub-circuit, wherein the first information in the first latch sub-circuit and the second information in the second latch sub-circuit are switched through the sensing node. According to the page buffers included in the memory device provided by the examples of the present application, by using at least two groups of two interdependent latch sub-circuits, the number of elements constituting the page buffers is reduced to some extent, and the area of a memory chip (such as a NAND chip) occupied by the page buffers is saved.

BRIEF DESCRIPTION OF THE DRAWINGS

In the drawings not necessarily drawn to scale, like labels may describe similar components in different views. Like numerals having different letter suffixes may represent different examples of similar components. The drawings illustrate generally, by way of example, but not by way of limitation, various examples discussed in the present application.

FIG. 14 is a flow diagram of a verify process provided by examples of the present application.

DETAILED DESCRIPTION

Figure 1:
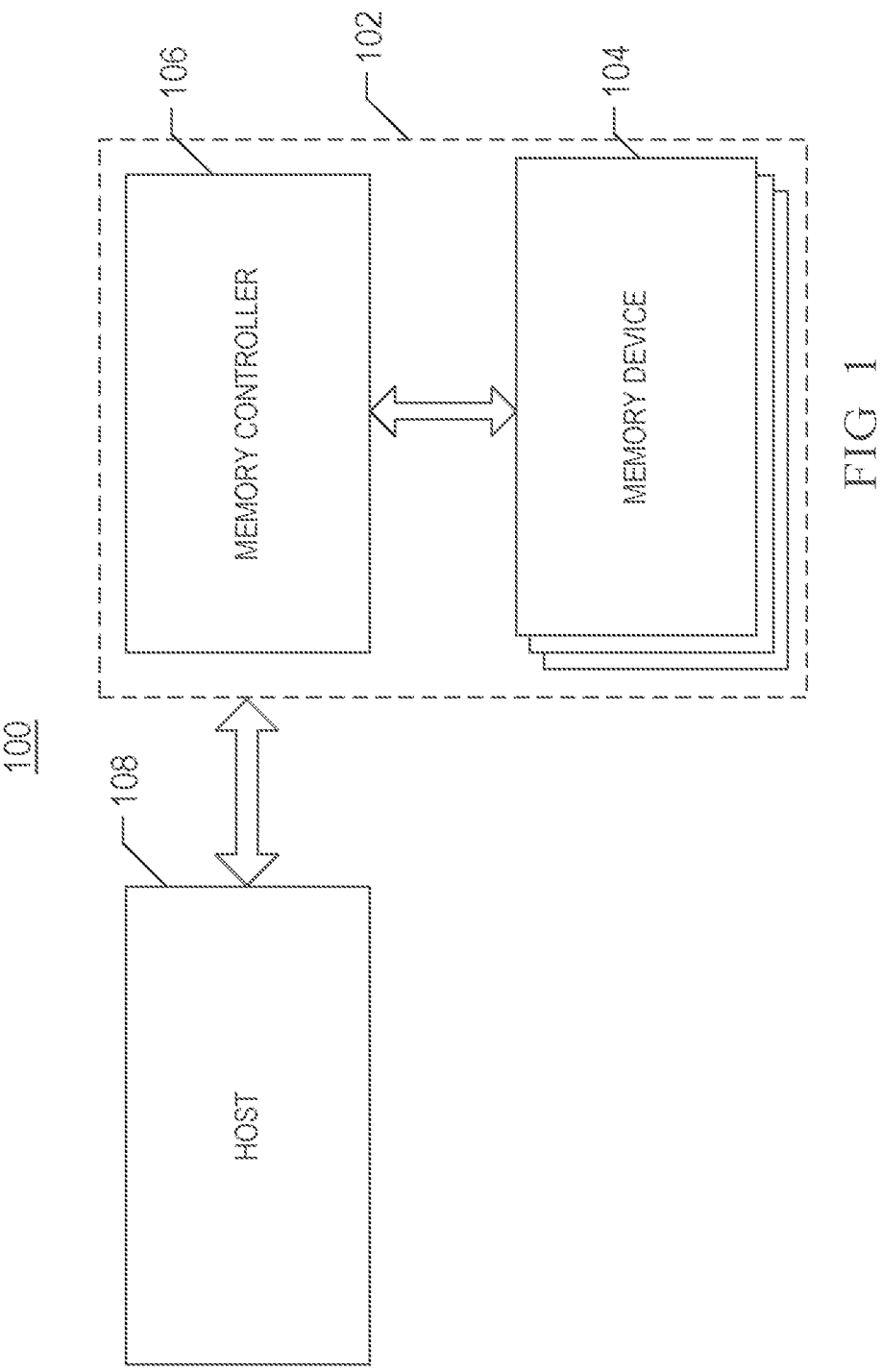
FIG. 1 is an example system block diagram of an electronic apparatus having a memory system provided by examples of the present application.

Various examples of the present application are described below in more detail with reference to the drawings. Elements and features in the examples of the present application may be configured or arranged differently to form other examples that may serve as variants of any example disclosed. Therefore, the examples of the present application are not limited to the examples as set forth herein. Instead, the described examples are provided to make the examples of the present application thorough and complete, and fully transfer the scope of the examples of the present application to those skilled in the art to which the examples of the present application pertain. It is to be noted that, references to "an example", "another example" and the like do not necessarily represent only one example, and different references to any such phrases are not necessarily directed to the same example. Although the terms "first", "second", "third" and the like may be used herein to identify various elements, these elements are not limited by these terms. These terms are used to distinguish one element from another element with the same or similar name. Thus, a first element in one example may be referred to as a second or third element in another example, without departing from the spirit and scope of the examples of the present application.

The drawings are not necessarily drawn to scale, and in some cases, may be scaled up to clearly illustrate the features of the examples. When an element is called as being connected or joined to another element, the former may be directly connected or joined to the latter, or electrically connected or electrically joined to the latter via one or more intervening elements therebetween. In addition, when an element is called as "between" two elements, it may be the only element between the two elements, or there may also be one or more intervening elements.

The terms as used herein are only used for the purpose of describing the specific examples, and are not intended to limit the present application. As used herein, a singular form is intended to include a plural form, unless the context clearly indicates otherwise. A general designation of the articles "a" and/or "an" as used in the examples and the appended claims of the present application should be interpreted as representing "one or more", unless otherwise specified or it may be clearly interpreted as a singular form from the context. The terms "comprise", "comprising", "include" and "including" as used in the examples of the present application specify the presence of the element, and do not preclude the presence or addition of one or more other elements. The term "and/or" as used in the examples of the present application include any or all combinations of one or more listed associated items. Unless otherwise defined, all terms including the technologies and sciences as used in the examples of the present application have the same meanings as those generally understood by those of ordinary skill in the art to which the present application pertains in the light of the examples of the present application. The terms such as those defined in common dictionaries should be interpreted as having a meaning that is consistent with their meanings in the context of the examples of the present application and the related art, and should not be interpreted in an idealized or overly formal sense unless otherwise defined expressly in the examples of the present application.

In the following description, numerous specific details are set forth to provide a thorough understanding of the present application, and the present application may be practiced without some or all of these specific details. In other cases, well-known processing structures and/or processing are not described in detail to avoid necessarily obscuring the present application. In some cases, unless otherwise stated particularly, it is apparent to those skilled in the art that a feature or element described with respect to one example may be used separately or in combination with other features or elements of another example. In the following, various examples of the present application are described in detail with reference to the drawings. The following description focuses on details to promote the understanding of the examples of the present application. Well-known technical details may be omitted to avoid obscuring the features and aspects of the examples of the present application.

The examples of the present application are further illustrated below in detail in conjunction with the drawings and particular examples.

FIG. 1 shows a block diagram of an example system having a memory provided according to some aspects of the present application. In FIG. 1, the system 100 may be a mobile phone, a desktop computer, a laptop computer, a tablet computer, a vehicle computer, a gaming console, a printer, a positioning apparatus, a wearable electronic apparatus, a smart sensor, a Virtual Reality (VR) apparatus, an Augmented Reality (AR) apparatus, or any other suitable electronic apparatuses having memories therein. As shown in FIG. 1, the system 100 may comprise a host 108 and a memory system 102, wherein the memory system 102 has one or more memory devices 104 and a memory controller 106; and the host 108 may be a processor of an electronic apparatus, such as a central processing unit (CPU) or a system on chip (SOC), wherein the system on chip may be, for example, an application processor (AP). The host 108 may be configured to send or receive data to or from memory devices 104. In an example, the memory devices 104 may be any memory disclosed in the present application, such as a Phase Change Random Access Memory (PCRAM), a three-dimensional NAND flash, etc.

According to some implementations, the memory controller 106 is coupled to the memory devices 104 and the host 108, and configured to control the memory devices 104. The memory controller 106 can manage data stored in the memory devices 104 and communicate with the host 108. In some examples, the memory controller 106 is designed for operating in a low duty-cycle environment such as Secure Digital (SD) cards, Compact Flash (CF) cards, Universal Serial Bus (USB) flash drives, or other media for use in electronic apparatuses in a low duty-cycle environment, such as personal computers, digital cameras, mobile phones, etc. In some examples, the memory controller 106 is designed for operating in a high duty-cycle environment such as SSDs or embedded Multi-Media Cards (eMMCs), wherein the SSDs or the eMMCs are used as data memories for mobile apparatuses in a high duty-cycle environment, such as smartphones, tablet computers, laptop computers, etc., and enterprise memory arrays. The memory controller 106 may be configured to control operations of the memory devices 104, such as read, erase, and program operations. The memory controller 106 may be further configured to manage various functions with respect to data stored or to be stored in the memory devices 104, including bad-block management, garbage collection, logical-to-physical address conversion, wear leveling, etc. In some implementations, the memory controller 106 is further configured to process error correction codes (ECCs) with respect to the data read from or written into the memory devices 104. The memory controller 106 may further perform any other suitable functions as well, for example, formatting the memory devices 104. The memory controller 106 may communicate with an external apparatus (e.g., the host 108) according to a particular communication protocol. For example, the memory controller 106 may communicate with the external apparatus through at least one of various interface protocols, such as a USB protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA protocol, a Parallel-ATA protocol, a Small Computer Small Interface (SCSI) protocol, an Enhanced Small Disk Interface (ESDI) protocol, an Integrated Drive Electronics (IDE) protocol, a Firewire protocol, etc.

Figure 3:
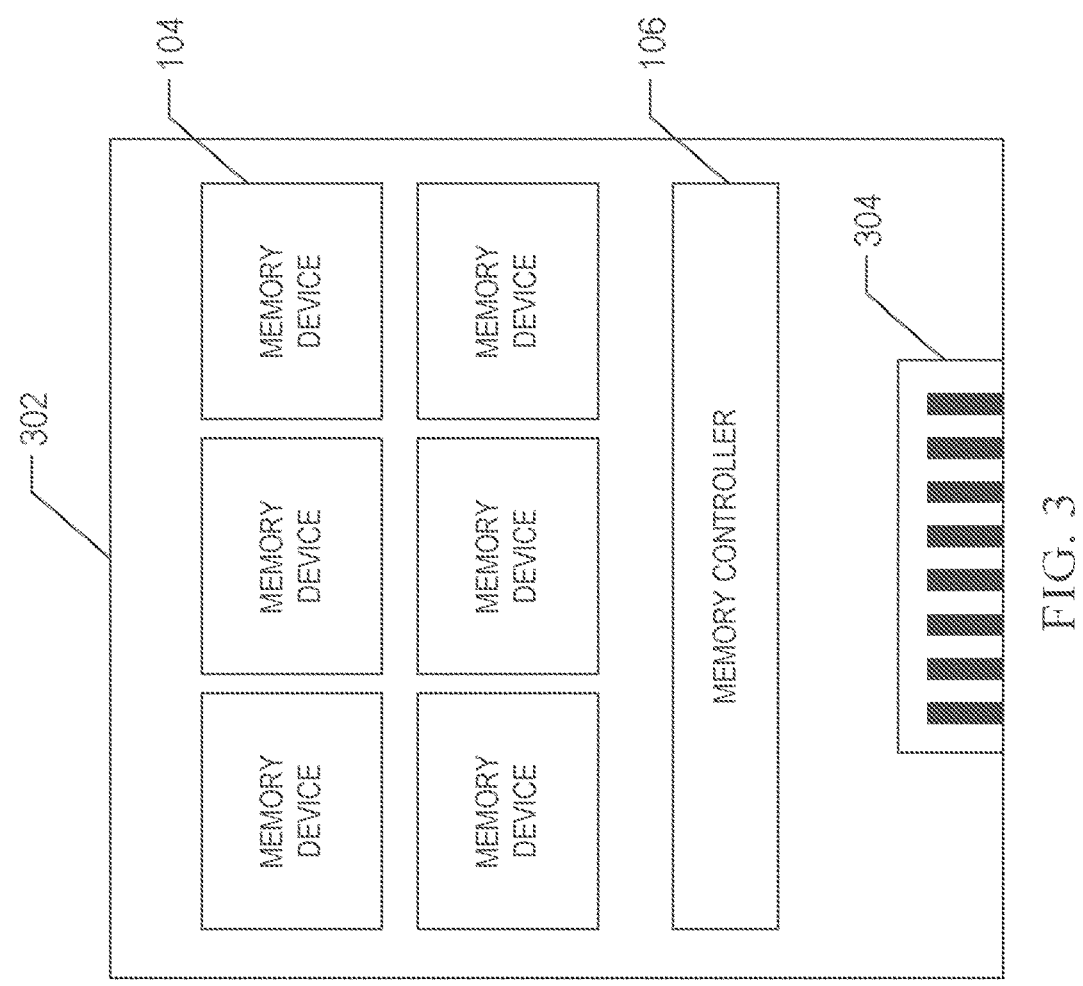
FIG. 3 is a schematic diagram of an example solid state drive (SSD) having a memory device provided by examples of the present application.
Figure 2:
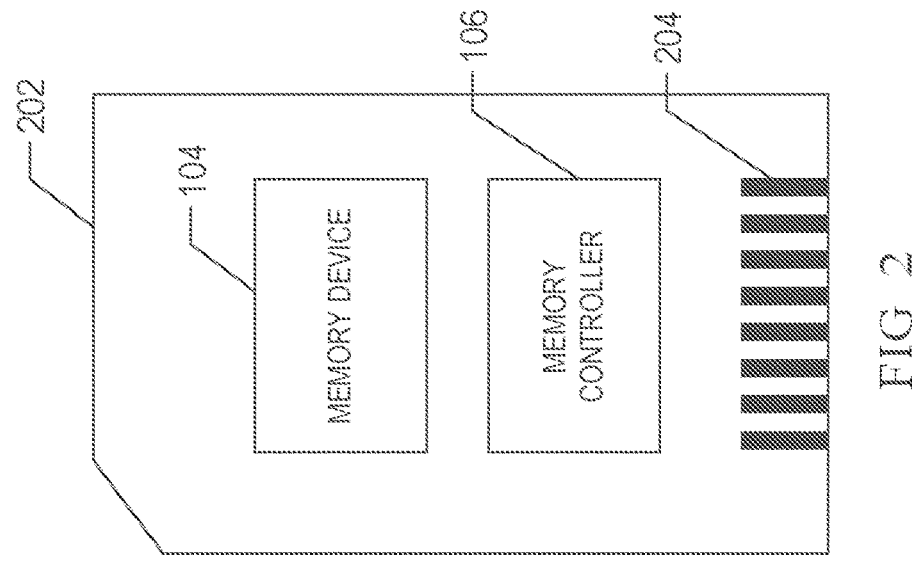
FIG. 2 is a schematic diagram of an example memory card having a memory device provided by examples of the present application.

The memory controller 106 and the one or more memory devices 104 can be integrated into various types of storage apparatuses, for example, be included in the same package, such as a Universal Flash Storage (UFS) package or an eMMC package. That is to say, the memory system 102 can be implemented and packaged into different types of electronic end products. In one example as shown in FIG. 2, the memory controller 106 and a single memory device 104 may be integrated into a memory card 202. The memory card may include a PC card (PCMCIA, Personal Computer Memory Card International Association), a CF card, a Smart Media (SM) card, a memory stick, a Multi-media card (MMC, RS-MMC, MMCmicro), an SD card (SD, miniSD, microSD, SDHC), a UFS, etc. The memory card may further comprise a memory card connector 204 coupling the memory card with a host (e.g., the host 108 in FIG. 1). In another example as shown in FIG. 3, the memory controller 106 and multiple memory devices 104 may be integrated into an SSD 302. The SSD may further comprise an SSD connector 304 coupling the SSD with the host (e.g., the host 108 in FIG. 1). In some implementations, storage capacity and/or operating speed of the SSD are greater than storage capacity and/or operating speed of the memory card. Furthermore, the memory controller 106 may be further configured to control erase, read and write operations of the memory devices 104.

Figure 4:
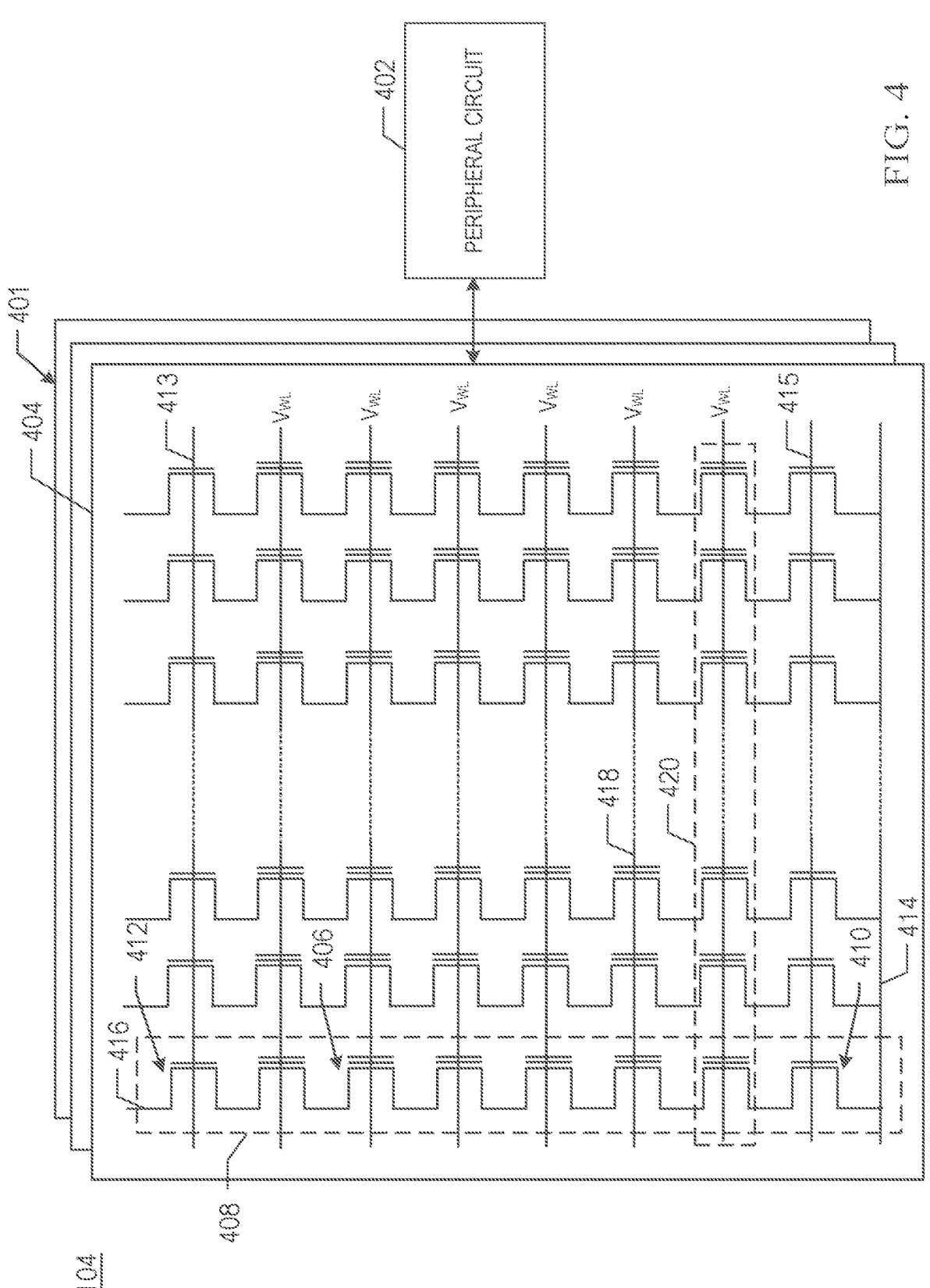
FIG. 4 is a schematic diagram of an example memory device comprising a peripheral circuit provided by examples of the present application.

FIG. 4 shows a schematic diagram of an example memory device comprising a peripheral circuit. As shown in FIG. 4, the memory device 104 may comprise a memory array 401 and a peripheral circuit 402 coupled to the memory array 401. The memory array 401 may be a NAND flash memory array, memory cells 406 are provided in an array of NAND memory strings 408, and each NAND memory string 408 extends vertically above a substrate (not shown). In some examples, each NAND memory string 408 comprises a plurality of memory cells 406 that are coupled in series and stacked vertically. Each memory cell 406 may hold a continuous, analog value, such as electrical voltage or charge, which depends on the number of electrons trapped within a memory region of the memory cell 406. Each memory cell 406 may be either a "floating gate" type memory cell that comprises a floating gate transistor, or a "charge trap" type memory cell that comprises a charge trap transistor.

In some examples, each memory cell 406 is a Single Level Cell (SLC) that has two possible data states and thus can store one bit of data, for example, the first data state "0" may correspond to a first voltage range, and the second data state "1" may correspond to a second voltage range. In some examples, the first voltage range and the second voltage range may be referred to as a threshold voltage distribution of the memory cells. In some examples, each memory cell 406 may be a Multi Level Cell (MLC), for example, the MLC can store two bits per cell, three bits per cell (also known as a Trinary Level Cell (TLC)), or four bits per cell (also known as a Quadruple Level Cell (QLC)), The data state of any type of memory cells includes one erase state and one or more program states. When a program operation is performed on the memory cell, the memory cell in the erase state is programmed to a certain program state. Generally speaking, voltage values in a voltage range corresponding to the program state of the memory cell are large.

As shown in FIG. 4, each NAND memory string 408 may comprise a source select gate (SSG) 410 at its source terminal and a drain select gate (DSG) 412 at its drain terminal. The SSG 410 and the DSG 412 may be configured to activate the selected NAND memory strings 408 (a column of the array) during the read and program (or write) operations. In some examples, sources of the NAND memory strings 408 in the same memory block 404 are coupled through the same source line (SL) 414 (e.g., a common SL). In other words, according to some implementations, all the NAND memory strings 408 in the same memory block 404 have an array common source (ACS). According to some implementations, the DSG 412 of each NAND memory string 408 is coupled to a respective bit line 416 which the data can be read from and written into via an output bus (not shown). In some examples, each NAND memory string 408 is configured to be selected or unselected by applying a select voltage (e.g., above a threshold voltage of a transistor having the DSG 412) or an unselect voltage (e.g., 0 V) to the respective DSG 412 via one or more DSG lines 413 and/or by applying a select voltage (e.g., above a threshold voltage of a transistor having the SSG 410) or an unselect voltage (e.g., 0 V) to the respective SSG 410 via one or more SSG lines 415.

As shown in FIG. 4, the NAND memory strings 408 can be organized into multiple memory blocks 404, each of which may have a common source line 414, e.g., coupled to the ground. In some examples, each memory block 404 is a basic data unit for the erase operation, i.e., all of the memory cells 406 on the same memory block 404 are erased at the same time. In order to erase the memory cells 406 in a selected memory block 404, the source lines 414 coupled to the selected memory block 404 as well as unselected memory blocks 404 that are in the same plane as the selected memory block 404 can be biased with an erase voltage (Vers), such as a high positive voltage 20 V or higher. In some examples, an erase operation may be performed at a half-block level, a quarter-block level, or a voltage level having any suitable number of blocks or any suitable fractions of a block. The memory cells 406 of adjacent ones of the NAND memory strings 408 may be coupled through word lines 418 that select which row of memory cells 406 receives the read and program operations.

Figure 5:
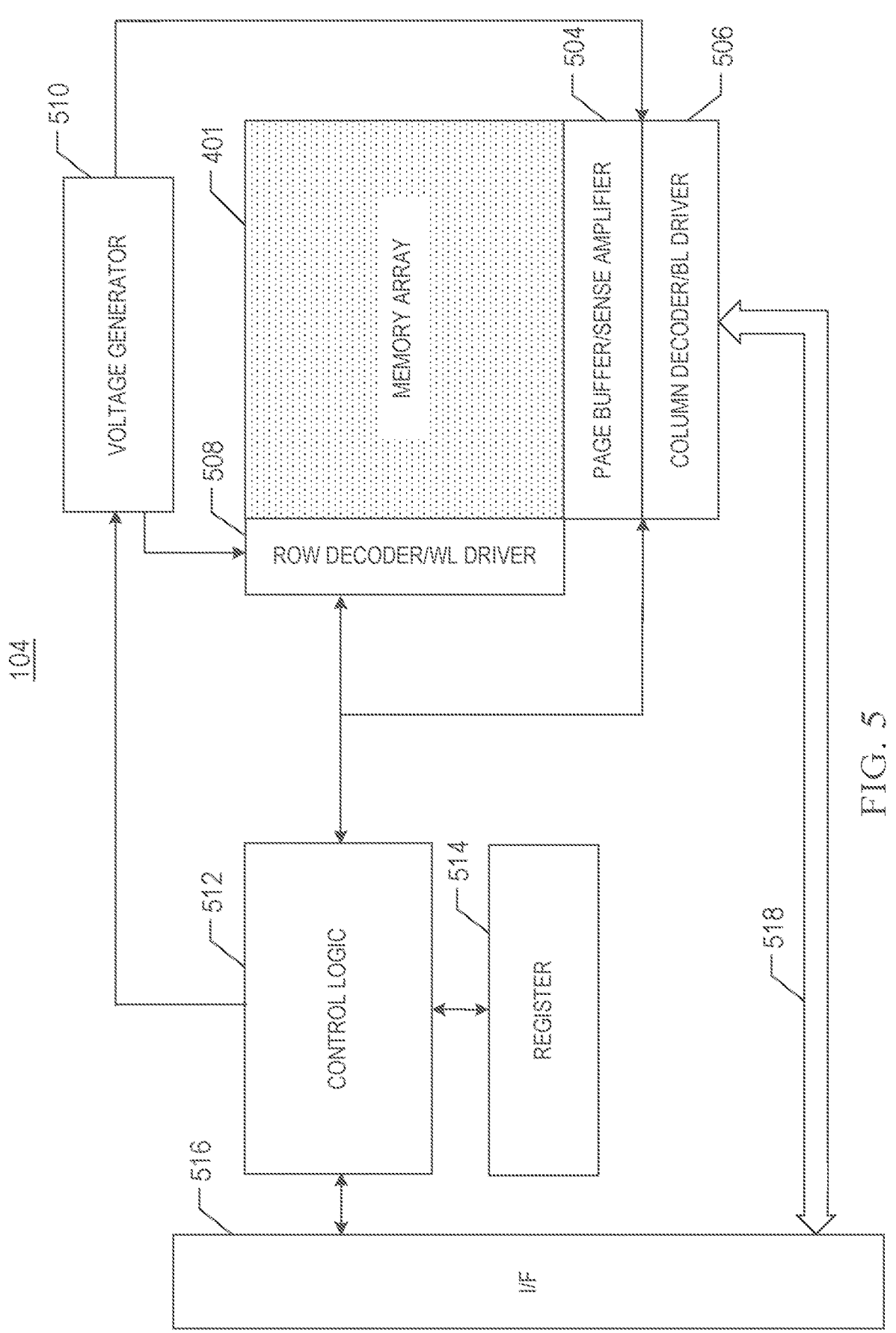
FIG. 5 is a block diagram of an example memory device comprising a memory array and a peripheral circuit provided by examples of the present application.

Referring back to FIG. 4, the peripheral circuit 402 may be coupled to the memory array 401 through the bit lines 416, the word lines 418, the source lines 414, the SSG lines 415 and the DSG lines 413. The peripheral circuit 402 may comprise any suitable analog, digital, and hybrid signal circuits for facilitating the operations of the memory array 401 by applying and sensing voltage signals and/or current signals to and from each target memory cell 406 via the bit lines 416, the word lines 418, the source lines 414, the SSG lines 415, and the DSG lines 413. The peripheral circuit 402 may include various types of circuits formed using a metal-oxide-semiconductor (MOS) technology. For example, FIG. 5 illustrates some example peripheral circuits. The peripheral circuit 402 comprises a page buffer/sense amplifier 504, a column decoder/bit line driver 506, a row decoder/word line driver 508, a voltage generator 510, a control logic 512, a register 514, an interface 516, and a data bus 518. In some examples, additional circuits not shown in FIG. 5 may be included as well.

The page buffer/sense amplifier 504 may be configured to read and program (write) data from and to the memory array 401 according to control signals from the control logic 512. In an example, the page buffer/sense amplifier 504 may store one page of program data (write data) to be programmed into one page 420 of the memory array 401. In another example, the page buffer/sense amplifier 504 may perform program verify operations to ensure that the data has been properly programmed into the memory cells 406 that are coupled to the selected word lines 418. In yet another example, the page buffer/sense amplifier 504 may also sense low power signals from the bit lines 416 that represent data bits stored in the memory cells 406, and amplify small voltage swings to recognizable logic levels in read operations. The column decoder/bit line driver 506 may be configured to be controlled by the control logic 512 and select one or more NAND memory strings 408 by applying bit line voltages generated from the voltage generator 510.

The row decoder/word line driver 508 may be configured to be controlled by the control logic 512 and select/unselect the memory blocks 404 of the memory array 401 and select/unselect the word lines 418 of the memory blocks 404. The row decoder/word line driver 508 may be further configured to drive the word lines 418 using word line voltages generated from the voltage generator 510. In some implementations, the row decoder/word line driver 508 may also select/unselect and drive the SSG lines 415 and the DSG lines 413. As described below in detail, the row decoder/word line driver 508 is configured to perform erase operations on the memory cells 406 that are coupled to one or more selected word lines 418. The voltage generator 510 may be configured to be controlled by the control logic 512 and generate a word line voltage (such as a read voltage, a program voltage, a pass voltage, a local voltage, a verify voltage, etc.), a bit line voltage and a source line voltage to be supplied to the memory array 401.

The control logic 512 may be coupled to each peripheral circuit described above and configured to control the operations of each peripheral circuit. The register 514 may be coupled to the control logic 512 and include a state register, a command register, and an address register for storing state information, command operation codes (OP codes), and command addresses for controlling the operations of each peripheral circuit. The interface 516 may be coupled to the control logic 512 and act as a control buffer to buffer and relay control commands received from a host (not shown) to the control logic 512 and state information received from the control logic 512 to the host. The interface 516 may also be coupled to the column decoder/bit line driver 506 via a data bus 518 and act as a data I/O interface and a data buffer to buffer and relay the data to and from the memory array 401.

Figure 6:
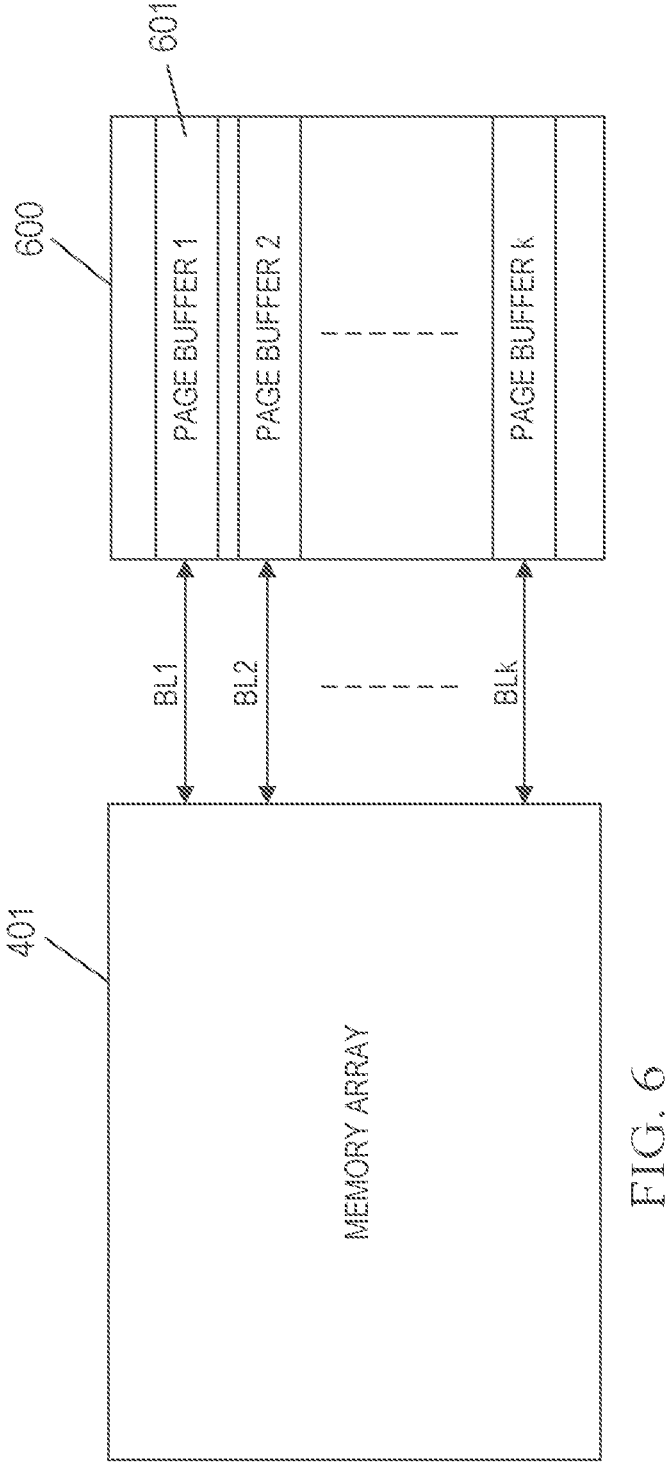
FIG. 6 is a schematic diagram of a relationship between a page buffer group and a memory array included in a memory device provided by examples of the present application.

For the memory device or the memory system as described above, the page buffer included therein is as shown in FIG. 6, which shows a schematic structural diagram of a page buffer group included in the memory device. In FIG. 6, the page buffer group further comprises the page buffer/sense amplifier 504 as described above. In the memory device, each bit line 416 is coupled with one page buffer, that is to say, in some examples, the memory device may comprise a page buffer group 600, wherein the page buffer group 600 may comprise a page buffer 1 (PBl) to a page buffer k (PBK), each page buffer 601 is coupled with the memory array 401 via a bit line, for example, the page buffers PBl to PBK may be coupled with the memory array 401 via respective bit lines BL1 to BLk. The page buffer as described in the present application is also any of the above page buffer group 600. As the storage density of the memory device increases, the number of page buffers used also increases significantly, thereby occupying a large area, resulting in large cost required to manufacture the memory device.

Figure 7:
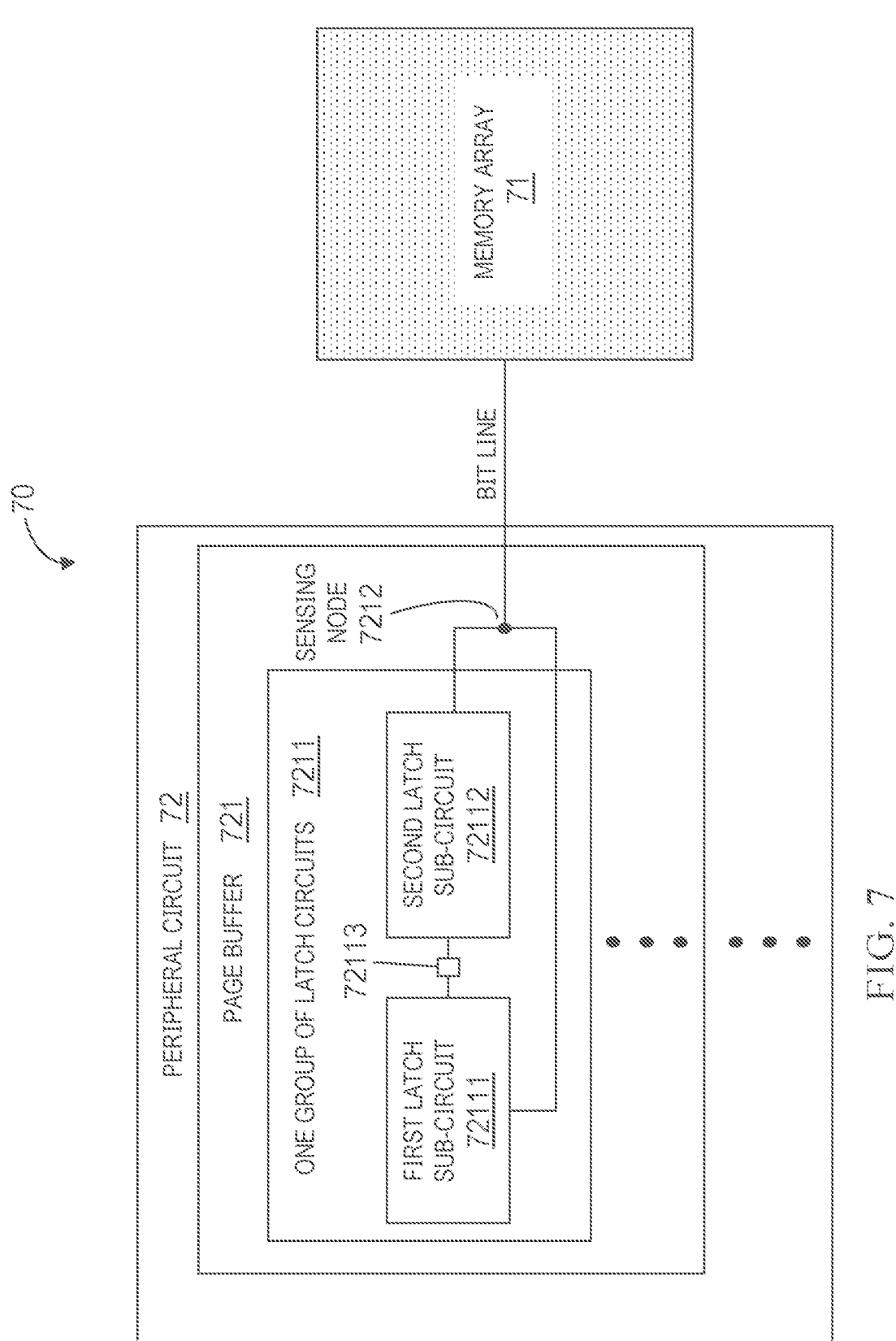
FIG. 7 is a schematic structural diagram of a memory device provided by examples of the present application.

In order to solve one or more of the above technical problems, examples of the present application provide a memory device. As shown in FIG. 7, the memory device 70 comprises:

a memory array 71 comprising a plurality of memory cells; and a peripheral circuit 72 coupled with the memory array and comprising a plurality of page buffers 721; each page buffer 721 comprises at least two groups of latch circuits 7211; and each group of the latch circuits 7211 comprises a first latch sub-circuit 72111 and a second latch sub-circuit 72112, wherein the first latch sub-circuit 72111 is coupled with a sensing node 7212 and is configured to latch first information on the sensing node 7212; and the second latch sub-circuit 72112 is coupled with the sensing node 7212 and configured to latch second information on the sensing node 7212 through the first latch sub-circuit 72111;

wherein the first information in the first latch sub-circuit 72111 and the second information in the second latch sub-circuit 72112 are switched through the sensing node 7212.

Here, a structure of the described memory array 71 may refer to, for example, a structure as depicted in FIG. 4 above. A majority of the structure of the described peripheral circuit 72 may refer to, for example, a structure as depicted in FIG. 5 above. In the present application, each page buffer 721 in the peripheral circuit comprises at least two groups of latch circuits 7211; and each group of the latch circuits comprises a first latch sub-circuit 72111 and a second latch sub-circuit 72112, wherein the first latch sub-circuit 72111 is coupled with the sensing node 7212 and is configured to latch the first information on the sensing node 7212; the second latch sub-circuit 72112 is also coupled with the sensing node 7212 and is configured to latch second information on the sensing node 7212 through the first latch sub-circuit 72111; and the first information in the first latch sub-circuit 72111 and the second information in the second latch sub-circuit 72112 are switched through the sensing node 7212. According to the above description, it indicates that there is a certain relationship of dependency between the first latch sub-circuit 72111 and the second latch sub-circuit 72112, such that when at least one of the first latch sub-circuit 72111 or the second latch sub-circuit 72112 need to be used in a program operation or a verify operation of the memory device 70, the two sub-circuits need to cooperate with each other to complete the respective operation, and the relationship of dependency between the two sub-circuits will be described in detail subsequently.

Here, the described SO 7212 may refer to a node in the page buffer 721 coupled with a respective bit line (a bit line with which the page buffer is connected). The SO 7212 is a relatively important node in a program process or a verify process of the memory device 70, and can help achieve multiple operations. For example, in some examples, the SO 7212 may be precharged to a high voltage level, and then the SO 7212 performs at least one discharge operation, thereby sensing voltages at the SO 7212 corresponding to different discharge stages of the memory cell through a sensing circuit in the page buffer 721, so as to determine whether verification of the memory cell is completed according to this sensing result. For another example, in some other examples, the SO 7212 may also read the second information in the second latch sub-circuit 72112, so as to switch the first information in the first latch sub-circuit 72111 with the second information in the second latch sub-circuit 72112. The two cases will be described in detail subsequently by examples.

Here, each group of the latch circuits as described may further comprise a pass control switch 72113. The pass control switch 72113 connects the first latch sub-circuit 72111 with the second latch sub-circuit 72112, and is configured to be in a turned-on state to pass the first information stored in the first latch sub-circuit 72111 to the second latch sub-circuit 72112 in response to a pass control signal.

That is to say, the first latch sub-circuit 72111 and the second latch sub-circuit 72112 described above are in a turned-on state through the pass control switch 72113 and under the control of the pass control signal; and at this time, the first information in the first latch sub-circuit 72111 may be stored to the second latch sub-circuit 72112.

The pass control switch 72113 may comprise a pass gate of a single MOS transistor structure or a pass gate of a double MOS transistor structure, wherein the double MOS transistor structure comprises a CMOS pass gate formed by connecting a PMOS transistor and an NMOS transistor in parallel.

The pass control switch 72113 may be implemented by various controllable switching elements, such as the pass gate of the single MOS transistor structure or the pass gate of the double MOS transistor structure provided by the examples of the present application.

Here, the second latch sub-circuit 72112 may comprise a parasitic capacitor for storing the second information, wherein the parasitic capacitor is connected with an end of the pass control switch away from the first latch sub-circuit 72111.

That is to say, the second latch sub-circuit 72112 stores the second information through the parasitic capacitor included therein.

The page buffer 721 included in the memory device 70 provided by the examples of the present application comprises at least two groups of latch circuits, and each group of latch circuits comprises a first latch sub-circuit 72111 and a second latch sub-circuit 72112 that are interdependent. The interdependence of the two sub-circuits is reflected in the following: on one hand, latching of the second information to the second latch sub-circuit 72112 can only be achieved by the assistance of the first latch sub-circuit 72111. For example, when the second latch sub-circuit 72112 latches the second information, the second information may be first latched onto the first latch sub-circuit 72111, and then the pass control switch 72113 is turned on to pass the second information into the parasitic capacitor of the second latch sub-circuit 72112, to achieve latching of the second information to the second latch sub-circuit 72112. On the other hand, the first information latched by the first latch sub-circuit 72111 and the second information latched by the second latch sub-circuit 72112 may be switched through the assistance of the pass control switch 72113 and the sensing node 7212. For example, when the first information and the second information need to be switched, the second information may be first read to the SO 7212, and then the pass control switch 72113 is turned on (i.e., the pass control signal is accessed to put the pass control switch 72113 in a turned-on state) to pass the first information to the second latch sub-circuit 72112 and latch the first information to the parasitic capacitor; then the first information in the first latch sub-circuit 72111 is cleared (the first latch sub-circuit 72111 is reset); and then the pass control switch 72113 is turned off (the pass control signal is removed to put the pass control switch 72113 in a turned-off state), and the second information on the SO 7212 is latched to the first latch sub-circuit 72111, thereby finishing switching of the first information and the second information. With this design, the number of components used in the second latch sub-circuit 72112 is reduced, such that area of a chip where the memory device 70 is located can be reduced, and the cost of manufacturing the memory device 70 can be saved.

During a practical application process, there are latch circuits for two purposes in the page buffer. The latch circuits for one purpose may be used to temporarily store data that is programmed and written into a memory array or to temporarily store data that is read from the memory array, and such a type of latch circuits may be referred to as data latch circuits; the latch circuits for the other purpose may be used to temporarily store intermediate data in a program operation (or a program process) of the memory cell or verify data in a verify operation (or a verify process) after the program operation, and such a type of latch circuits may be referred to as sensing circuits, wherein the sensing circuits at least comprise main latch circuits. The specific interpretation of the intermediate data and the verify data is described in detail later in the description of the program process and the verify process.

On this basis, in some examples, the at least two groups of latch circuits are configured to store to-be-written data or read data.

That is to say, at least two groups of latch circuits provided by the examples of the present application are all used to temporarily store some or all of the to-be-written data and the read data.

In some examples, one group of the at least two groups of latch circuits is configured to store the intermediate data in the program process or the verify data in the verify process; and other groups of the at least two groups of latch circuits are configured to store the to-be-written data or the read data.

That is to say, one of at least two groups of latch circuits provided by the examples of the present application are used to temporarily store the intermediate data in the program process or the verify data in the verify process, and the other remaining groups of latch circuits are used to store some or all of the to-be-written data or the read data.

In some examples, the at least two groups of latch circuits comprise two groups of latch circuits, wherein the two groups of latch circuits are configured to store Low Page (LP) data, Middle Page (MP) data, Up Page (UP) data and Extra Page (XP) data of the to-be-written data or the read data.

When the memory cell is configured to be as a QLC type, the memory cell may store 4 bits of data, namely Low Page (LP) data, Middle Page (MP) data, Up Page (UP) data and Extra Page (XP) data. In such a configuration, for 16 data states corresponding to the memory cell (i.e., with 16 threshold voltage distributions, and a threshold voltage of each memory cell belonging to one of the 16 threshold voltage distributions), 4 latch circuits are needed to store the LP data, the MP data, the UP data and the XP data. The four latch circuits may use two groups of latch circuits provided by the present application (including two first latch sub-circuits and two second latch sub-circuits, 4 latch circuits in total) to respectively store the LP data, the MP data, the UP data and the XP data.

That is, if the at least two groups of latch circuits comprise two groups of latch circuits, the two groups of latch circuits are both used as data latch circuits; then when the memory cell is configured as an QLC type, the memory cell comprises 16 data states corresponding to 4 pages of data (the LP data, the MP data, the UP data and the XP data), and each latch circuit of the two groups of latch circuits is used to store the corresponding LP data, the MP data, the UP data and the XP data.

In some examples, the at least two groups of latch circuits comprise: three groups of latch circuits, wherein two groups of latch circuits are configured to store the LP data, the MP data, the UP data and the XP data corresponding to the to-be-written data or the read data; and the remaining group of latch circuits is configured to store the intermediate data in the program process or the verify data in the verify process.

The page buffer provided by the present application may comprise three groups of latch circuits, and the structure of each group of the latch circuits is as those described in FIG. 7 above. When the memory cell is also configured as a QLC type, two of the three groups of latch circuits may be used to store the LP data, the MP data, the UP data and the XP data corresponding to the to-be-written data or the read data, and the remaining group of latch circuits may be used to store the intermediate data in the program process or the verify data in the verify process.

Here, the described intermediate data in the program process may include data on the sensing node temporarily stored in the latch circuit not used by the operations before the operations because certain operations will damage data (or information) on the sensing node in the program process. The described verify data in the verify process may include verify results in the verify process of 4BL sensing information, 3BL sensing information, pass sensing information, etc. in a program verify operation using a 4BL (bit line) solution.

When the at least two groups of latch circuits comprise two groups of latch circuits, using the following design is also feasible: for example, one group is used to store a part of the to-be-written data or the read data, and the other group is used to store the intermediate data in the program process or the verify data in the verify process. In such a design, the page buffer further comprises other independent latch circuits to be used to store the other part of the to-be-written data or the read data. The specific situations may be determined according to specific circuits. Here, the memory cell may be further configured as a Double level cell (DLC) or a TLC or a SLC or other types. Different types of memory cells require different numbers of data latch circuits, but the working principle of each group of the latch circuits provided by the examples of the present application is the same; therefore, in the following description, unless otherwise specified, the memory cell is configured as a QLC type to illustrate how the page buffer provided by the examples of the present application works in the memory device.

Figure 8:
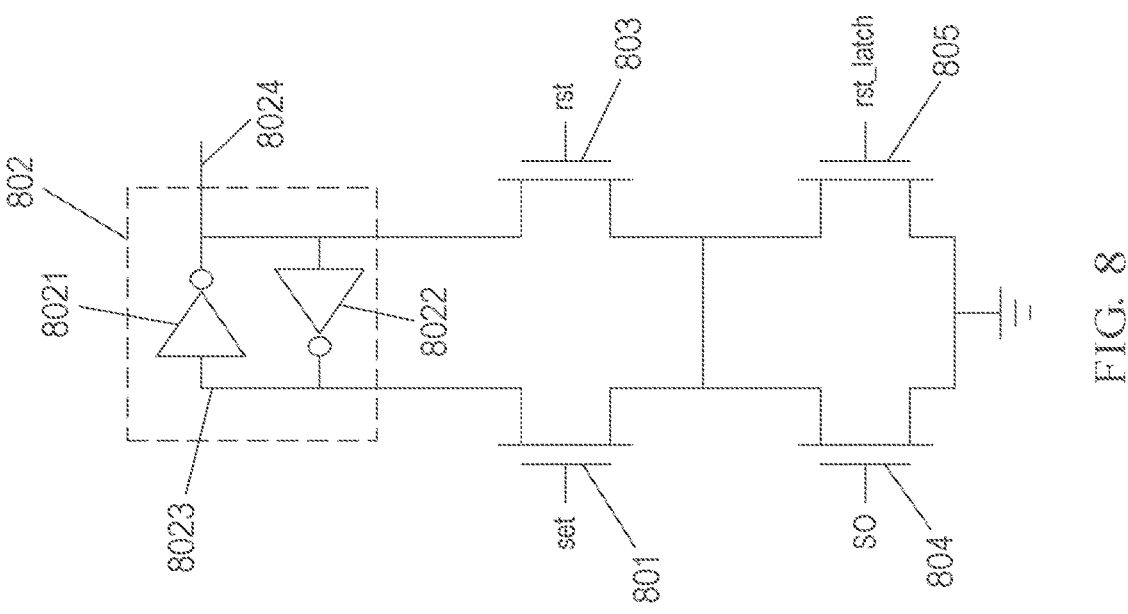
FIG. 8 is a schematic structural diagram of a first latch sub-circuit provided by examples of the present application.

In some examples, as shown in FIG. 8, the first latch sub-circuit may comprise a set switch 801 and a storage element 802, wherein the set switch 801 is coupled with the sensing node and connected with the storage element, and is configured to latch the first information on the sensing node to the storage element 802 in response to a set signal.

In some examples, the first latch sub-circuit may further comprise: a reset switch 803 that is connected with the storage element 802 and configured to reset the storage element in response to a reset signal.

The first latch sub-circuit may be also referred to as a static latch that may comprise a set switch and a storage element, wherein the set switch may be a control switch for writing data to the storage element, and is configured to latch the first information on the sensing node to the storage element in response to a set signal, i.e., to write (or store) the first information on the sensing node to the storage element. The first latch sub-circuit may further comprise a reset switch coupled with the storage element, wherein the reset switch may be a control switch for resetting the storage element included in the first latch sub-circuit, and is configured to reset the storage element in response to a reset signal.

As shown in FIG. 8, the storage element 802 may comprise: a first phase inverter 8021 and a second phase inverter 8022, wherein an input end of the first phase inverter 8021 is connected with an output end of the second phase inverter 8022 to form a first node 8023; an output end of the first phase inverter 8021 is connected with an input end of the second phase inverter 8022 to form a second node 8024; and the second node 8024 is connected with the second latch sub-circuit and is configured to store the first information.

The set switch 801 comprises a first transistor with one end connected to the first node 8023; and the reset switch 803 comprises a second transistor with one end connected to the second node 8024, wherein the other end of the first transistor is connected with the other end of the second transistor.

Here, both the first transistor and the second transistor may be NMOS transistors. A control end of the first transistor passes the first information on the SO to the second node 8024 when a set signal set is accessed. A control end of the second transistor resets the second node 8024 included in the storage element when a reset signal rst is accessed.

In some examples, as shown in FIG. 8, the first latch sub-circuit may further comprise: a sensing control switch 804 with one end connected to the set switch 801 and the reset switch 803, and with the other end being grounded; and the sensing control switch 804 is configured to be turned on under a voltage level of the sensing node and write the first information of the sensing node to the storage element through the set switch 801.

A type of the reset control switch may be the same as a type of the set switch 801 and the reset switch 803. That is, the reset control switch may also comprise an NMOS transistor which may be referred to as a sensing transistor.

In some examples, the first latch sub-circuit may further comprise: a reset control switch 805 that is connected with the set switch 801 and the reset switch 803 at one end and is grounded at the other end; and the reset control switch 805 is further configured to reset the first latch sub-circuit through the reset switch 803 in response to a reset control signal, wherein the reset control signal is generated by control of a control logic included in the peripheral circuit.

A type of the reset control switch 805 may be the same as a type of the set switch 801 and the reset switch 803. That is, the reset control switch 805 may also comprise an NMOS transistor which may be referred to as a reset transistor.

That is to say, on the basis of the aforementioned reset switch 803, the set switch 801 and the storage element, the first latch sub-circuit may further comprise a sensing control switch which is turned on or off according to a voltage level of the SO, and writes the first information on the sensing node to the storage element through the set switch 801 when the sensing control switch is turned on. The first latch sub-circuit may further comprise a reset control switch 805 which accesses to a reset control signal to reset the first latch sub-circuit through the reset switch 803. The reset control signal may be generated by control of the control logic included in the peripheral circuit according to actual situations.

According to the first latch sub-circuit as shown in FIG. 8, the turning-on or turning-off of the sensing transistor is affected by the voltage level of the sensing node. In some examples, the sensing transistor may be an NMOS transistor, wherein a gate terminal of the NMOS transistor is connected with the sensing node, a drain terminal is connected with source terminals of the first transistor and the second transistor connected together, and a source terminal is grounded. In this case, when the voltage level of the sensing node is at a high voltage level (e.g., a voltage of the high voltage level is greater than an turning-on voltage of a third transistor), the sensing transistor applies a ground voltage to the first transistor or the second transistor, and then the control end of the first transistor stores the ground voltage at the first node when the set signal is accessed; or the control end of the second transistor stores the ground voltage at the second node when the reset signal is accessed. In some examples, when the ground voltage is stored at the first node, it may represent stored data "0".

In an example, the first node may store the ground voltage in the following approach: when the sensing transistor is turned on, the ground voltage is allowed to be passed to the first transistor through the sensing transistor, and the first transistor is turned on under the set control signal and transfers the ground voltage to the first node. The second transistor is turned on under the reset control signal and transfers the ground voltage to the second node.

In some examples, when the voltage of the first node is at a high voltage level (e.g., the voltage higher than the ground voltage is the high voltage level), it may be used to represent stored data "1"; and correspondingly, the voltage of the second node at this time is a low voltage (e.g., the ground voltage), which may be used to represent stored data "0". In some other examples, when the voltage of the second node is at a high voltage level, it may be used to represent stored data "1"; and correspondingly, the voltage of the first node at this time is a low voltage, which may be used to represent stored data "0". During a practical application process, it is also possible that when the first node is at a low voltage level, it represents stored data "1"; and otherwise, when the first node is at a high voltage level, it represents stored data "0". The specific way of representation depends on the specific way of coding.

For an optional implementation when the ground voltage is passed to the first node, it means that the data on the SO is stored at the second node; and when the ground voltage is passed to the second node, it means that the storage element is reset. Whether the data "0" or the data "1" is used to represent the data of the SO depends on the specific way of coding.

A control logic and an implementation of the sensing control switch described above are as shown in FIG. 8. For the first latch sub-circuit 72111 which may further comprise the reset control switch 805, the role of the reset transistor included in the reset control switch 805 may be to reset the first latch sub-circuit to clear the first information in the first latch sub-circuit when the first information in the first latch sub-circuit and the second information in the second latch sub-circuit are switched. A process of switching the first information in the first latch sub-circuit with the second information in the second latch sub-circuit may be as follows: first, the second information in the second latch sub-circuit is read to the SO; then the control switch is turned on to pass the first information into the second latch sub-circuit; and then the first latch sub-circuit is reset to clear the first information included therein, such that the first latch sub-circuit is recovered to an initial state (e.g., the first node or the second node of the first latch sub-circuit stores the data "1" or the data "0" to recover the initial state). The reset transistor here plays a role of resetting the first latch sub-circuit, and a reset control signal rst_latch accessed to the control end of the reset transistor may be directly generated by the control logic 512 in the aforementioned peripheral circuit, that is, the reset operation may be directly controlled by the control logic 512.

For the first latch sub-circuit as shown in FIG. 8, if the second node stores the first information, according to the working principle described above, the reset of the first latch sub-circuit may also be achieved by the reset transistor and the first transistor, that is, when both the reset transistor and the first transistor are in a turned-on state, the ground voltage is latched at the first node; and if a high voltage level represents a reset logic, then the second node is at a high voltage level at this time, that is, the reset operation is achieved. That is to say, whether the set switch 801 and the reset switch 803 in the first latch sub-circuit are used for setting or resetting depends on what the specific control logic is, and any control logic is feasible as long as it can be achieved and is logically reasonable. That is to say, specific operation steps of resetting and setting are not limited.

Figure 9:
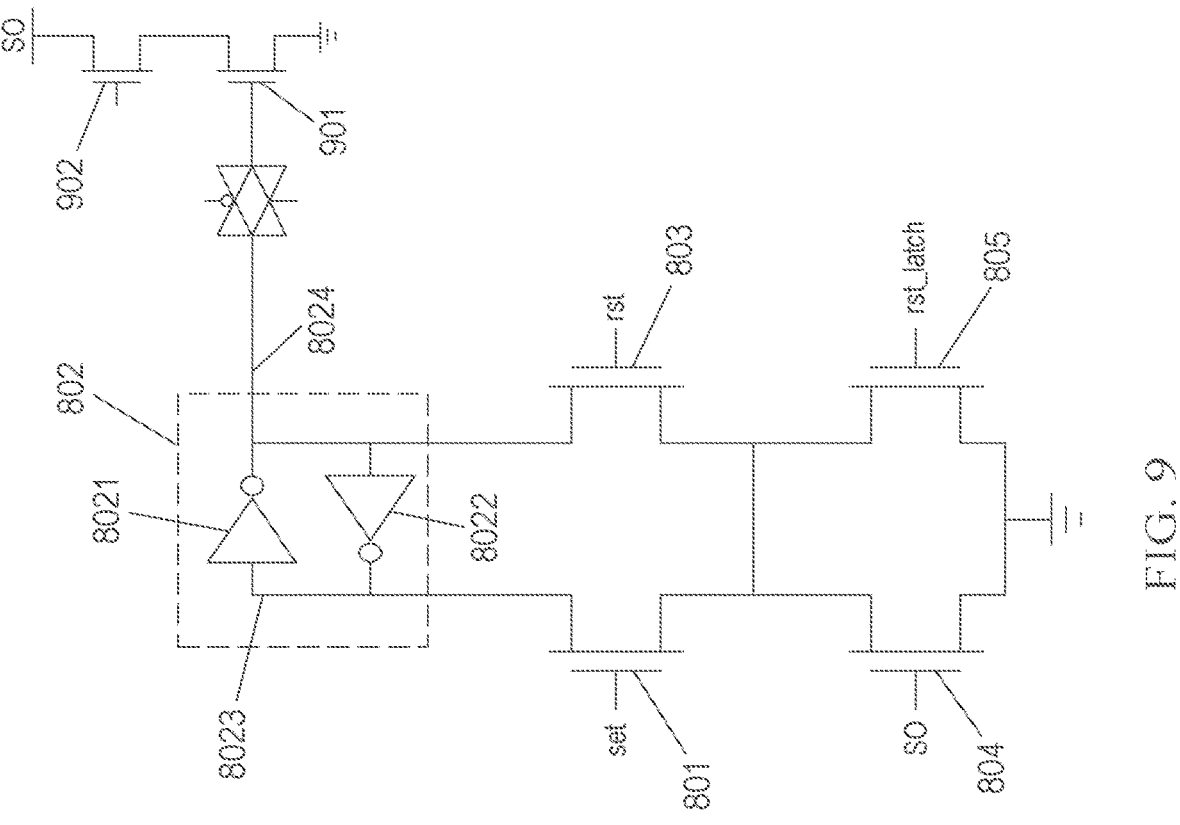
FIG. 9 is a schematic diagram of a connection relationship of coupling a second latch sub-circuit to a sensing node (SO) provided by examples of the present application.

In some examples, as shown in FIG. 9, each group of the latch circuits further comprises a first control switch 901 and a second control switch 902 that are connected in series between the sensing node and the ground, wherein the first control switch 901 is controlled by the second information latched by the second latch sub-circuit; and the second control switch 902 is controlled by the read control signal, wherein when the second information controls the first control switch 901 to be turned on and the read control signal controls the second control switch 902 to be turned on, the second information is read to the sensing node.

The first control switch 901 and the second control switch 902 here may also comprise an NMOS transistor, and the first control switch 901 and the second control switch 902 are connected in series between the sensing node and the ground, are controlled by the second information and the read control signal respectively, and may be used to achieve circuit connection for switching of the first information and the second information described above. In an example, a process of achieving the switching of the first information and the second information described above may be as follows: under the read control signal, the second control switch 902 is in a turned-on state, and the second information in the second latch sub-circuit is read to the SO; then under the pass control signal, the pass control switch is turned on to pass the first information into the second latch sub-circuit; then, a reset operation is performed on the first latch sub-circuit; and finally, under the set signal, the first transistor is in a turned-on state, and the second information is latched into the first latch sub-circuit, thereby achieving the switching of the first information and the second information.

In some examples, the page buffer 721 may further comprise a main latch circuit coupled with the sensing node and configured to store intermediate data in a program process or verify data in a verify process, wherein a structure of the main latch circuit is the same as a structure of the first latch sub-circuit; or a structure of the main latch circuit is the same as a structure of the first latch sub-circuit, except that the main latch circuit and the first latch sub-circuit share the sensing control switch 804 and the reset control switch 805.

That is to say, a structure of the described main latch circuit is the same as a structure of the first latch sub-circuit, that is, the main latch circuit comprises the first phase inverter, the second phase inverter, the first transistor, the second transistor, the sensing transistor and the reset transistor that are included in the first latch sub-circuit, and connection structures among various elements are also the same as the connection of the first latch sub-circuit. In some other implementations, the first phase inverter, the second phase inverter, the first transistor and the second transistor included in the main latch circuit are the same as the structure of the first latch sub-circuit, and the main latch circuit may share the sensing transistor and the reset transistor with the first latch sub-circuit.

The intermediate data in the program process described here has the same meaning as described above, which is no longer repeated here. The described verify data in the verify process also has the same meaning as described above, which is no longer repeated here. The described main latch circuit and the aftermentioned first sensing latch circuit may refer to the same latch circuit, such as ds. Descriptions of the main latch circuit in the memory device and descriptions of the first sensing latch circuit in the aftermentioned operation method are used to form a corresponding relationship with a second sensing latch circuit (such as dl) and a third sensing latch circuit (such as dm), which are only different names used by different descriptions for ease of description with no effect of limitation.

In some examples, the page buffer may further comprise a data pass circuit coupled with one of the two groups of latch circuits and configured to: receive the to-be-written data and pass the to-be-written data into each of the two groups of latch circuits, or output the read data.

The data pass circuit may be used to receive, through a data path, the to-be-written data to be written into the memory device to the latch circuit of the page buffer for temporary storage for subsequent programming. The data pass circuit is coupled to one of the two groups of latch circuits used for data latch, that is to say, the data pass circuit may sequentially access LP, MP, UP and XP of the to-be-written data, and sequentially store the corresponding data into the corresponding latch circuits of the two groups of latch circuits. The data pass circuit may also output the read data to the data path, such that the memory device feeds back the read data to the memory controller or the host.

In some examples, the page buffer may further comprise a precharge circuit and a discharge circuit, wherein the precharge circuit is configured to precharge the sensing node corresponding to the selected memory cell in response to a precharge signal; and the discharge circuit is configured to discharge the sensing node corresponding to the selected memory cell in response to a discharge signal.

Both the precharge circuit and the discharge circuit are coupled to corresponding bit lines, and cooperate with each other to achieve precharge or discharge of the sensing node, thereby achieving a certain data latch operation. For example, in a verify process, the precharge circuit is first used to precharge the sensing node SO to a preset initial voltage, and then at least one discharge is performed on the sensing node SO through the discharge circuit to finish at least one verify operation. In the at least one verify operation, a verify result may be latched into the aforementioned main latch circuit or other relevant latch circuits. There may be multiple implementations for the structures of the precharge circuit and the discharge circuit. The following description may use one implementation for illustrating its working principle.

Figure 10:
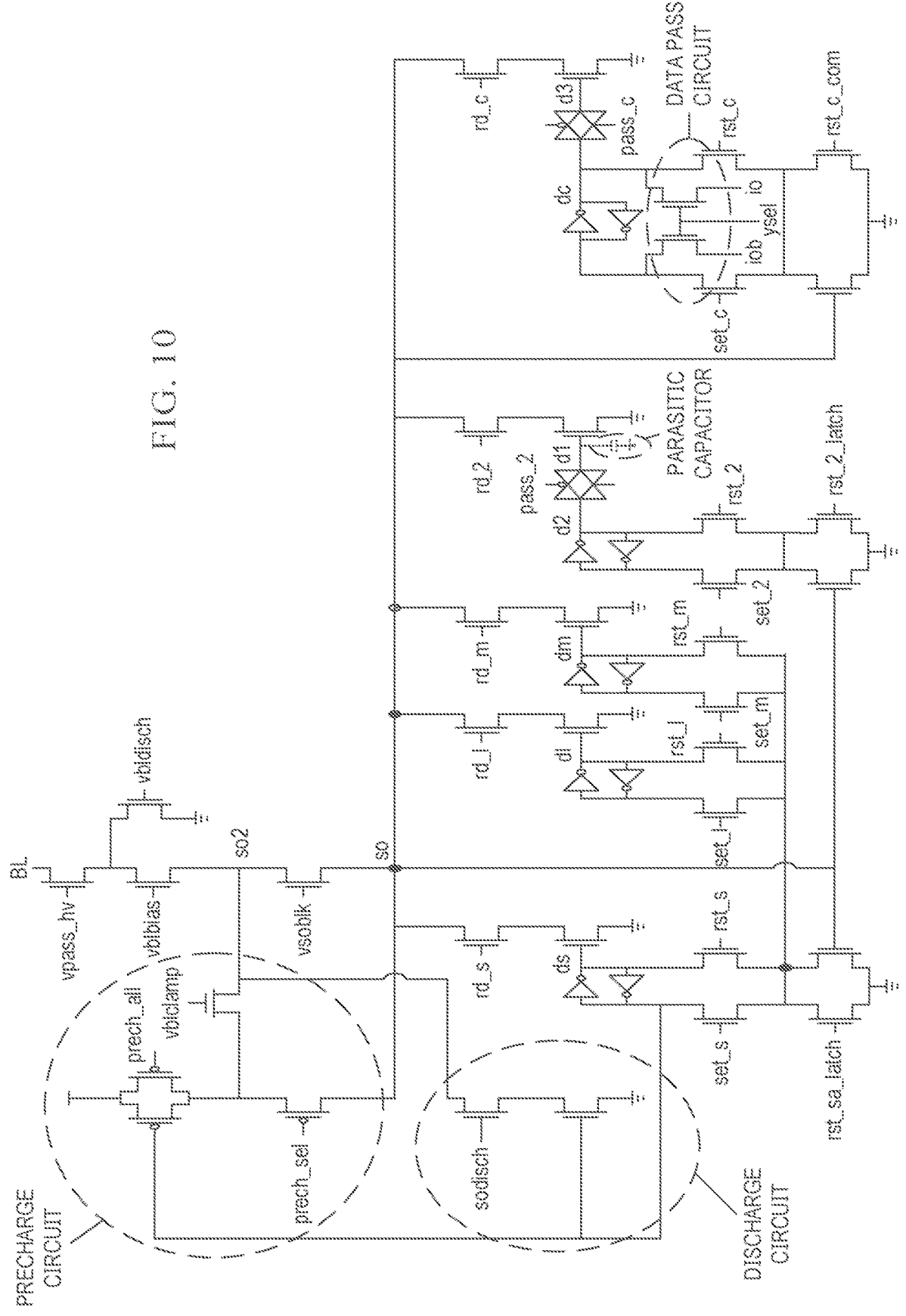
FIG. 10 is a schematic structural diagram of a page buffer comprising two groups of latch circuits provided by examples of the present application.
Figure 11:
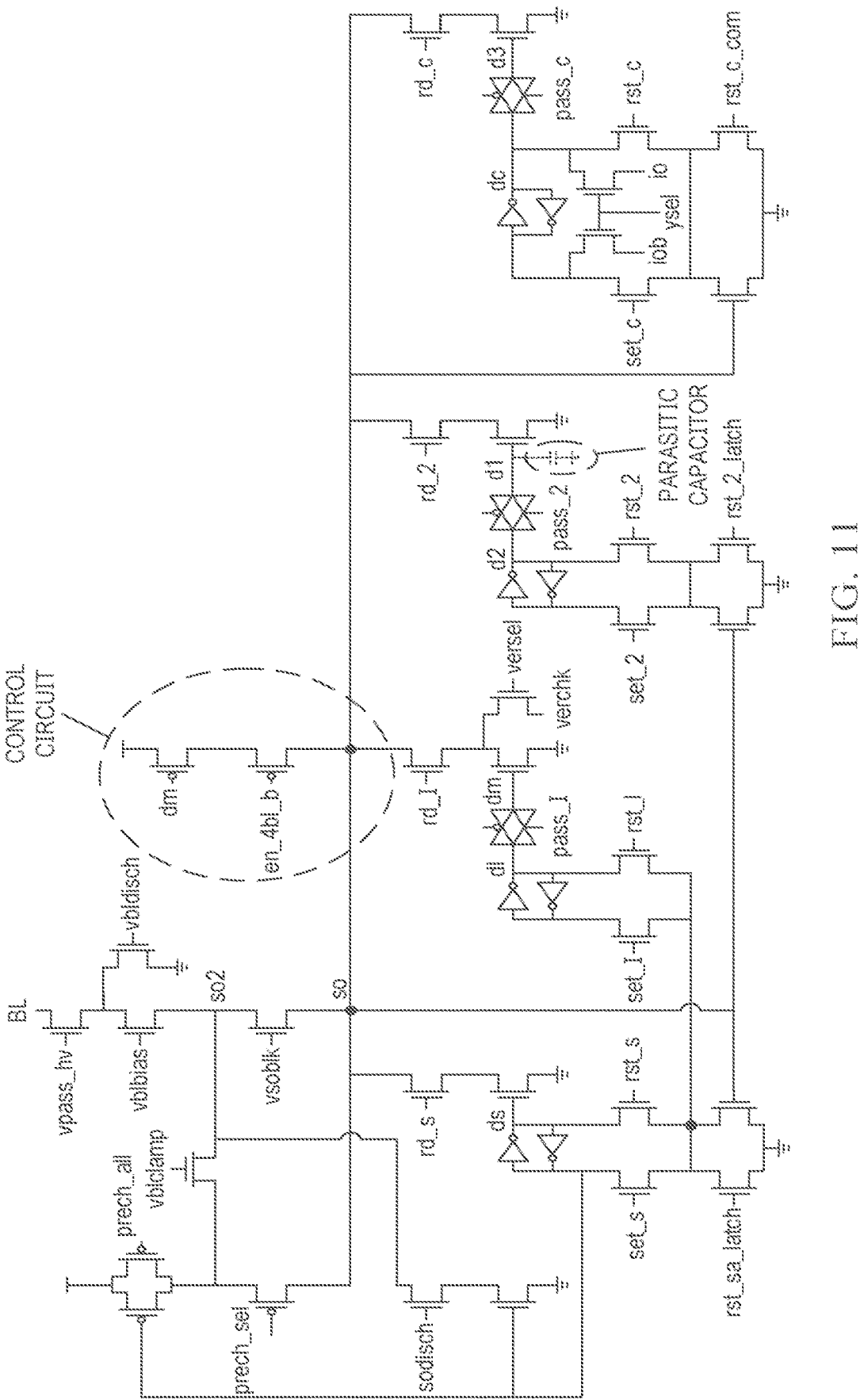
FIG. 11 is a schematic structural diagram of a page buffer comprising three groups of latch circuits provided by examples of the present application.

In order to know the structure of the page buffer included in the memory device provided by the examples of the present application, as shown in FIGS. 10 and 11, FIG. 10 is a schematic structural diagram of two groups of latch circuits included in the page buffer provided by examples of the present application, and FIG. 11 is a schematic structural diagram of three groups of latch circuits included in the page buffer provided by examples of the present application.

The page buffer provided by FIG. 10 comprises two groups of latch circuits for storing to-be-written data or read data: one group of latch circuits comprising d2 (a first latch sub-circuit) and d1 (a second latch sub-circuit), and the other group of latch circuits comprising dc (a first latch sub-circuit) and d3 (a second latch sub-circuit), wherein d1 is connected with d2 through a pass control switch which is configured to connect through d2 with d1 in response to a pass control signal pass_2, and finish switching between information in d2 and d1 by virtue of the assistance of the SO, wherein second information in d1 is stored in the parasitic capacitor included therein. dc and d3 are similar, which is no longer repeated here. The page buffer further comprises a main latch circuit ds (or a first sensing latch circuit), a latch circuit d1 (a second sensing latch circuit) for storing 3BL sensing information, and a latch circuit dm (a third sensing latch circuit) for storing 4BL sensing information. The page buffer further comprises a precharge circuit and a discharge circuit, wherein the precharge circuit comprises three P-type transistors, wherein a connection structure of the three P-type transistors is as follows: two P-type transistors are connected in parallel to form a pass gate, and then connected with another P-type transistor; a supply voltage (such as VDD) is applied to one end of the precharge circuit in the structure, and the other end is connected with the SO and charges the sensing node in response to a precharge signal (a Prech_all signal and a Prech_sel signal). The discharge circuit comprises two N-type transistors connected in series between the sensing node and the ground (GND), and is configured to discharge the SO in response to a discharge signal sodisch. As shown in FIG. 10, the page buffer further comprises a data pass circuit configured to receive to-be-written data or output read data.

The structures of the page buffers shown in FIGS. 11 and 10 are substantially the same, except that: the latch circuit d1 for storing the 3BL sensing information and the latch circuit dm for storing the 4BL sensing information also employ structure forms of the first latch sub-circuit and the second latch sub-circuit. In such a design, the page buffer further comprises a control circuit, wherein the control circuit comprises two N-type transistors (a first control switch and a second control switch) connected in series between the supply voltage and the sensing node, and is configured to read information in dm to the sensing node in response to a control signal en_4bl_b, such that information (such as the 3BL sensing information) latched in d1 is subsequently passed to dm, and then relevant information (such as the 4BL sensing information) is latched in d1.

FIGS. 10 and 11 are only two example structures based on the inventive concept provided by the examples of the present application. Without departing from the inventive concept of the present application, the page buffer may also have other structures, which is no longer repeated here.

Based on the page buffer of FIGS. 10 and 11, the basic working principle of each group of the latch circuits is as follows:

(1) the information in the first latch sub-circuit and the second latch sub-circuit is switched. By taking d1 and d2 as an example, here, D1 represents second information stored by d1, and D2 represents first information stored by d2, i.e., D1/D2 are switched.

A specific operation may comprise: first applying a prech_all+prech_sel signal to precharge the sensing node, wherein this operation may be represented with "prech_all+prech_sel (SO=1)"; then applying a rd_2 signal (a read control signal), such that the second information in d1 is read to the SO, which is represented with rd_2 (SO=~D1); then applying pass_2 (a pass control signal), and passing the first information in d2 to d1, which is represented with pass_2 (D1=D2); then applying rst_2_latch (a reset control signal)+set_2 (a set signal), and resetting d2, which is represented with rst_2_latch+set_2 (D2=1); and finally, applying rst_2 (a reset signal), and latching the second information to d2, which is represented with rst_2 (D2=~SO=D1).

(2) The data of the latch circuit is read to the SO (the first latch sub-circuit or the second latch sub-circuit).

For the second latch sub-circuit, reading d1 is taken as an example.

Its process is as follows: prech_all+prech_sel (SO=1); and rd_2 (SO=~D1).

For the first latch sub-circuit, reading d2 is taken as an example. Its process may be: first switching the information in the first latch sub-circuit and the second latch sub-circuit, and then reading the information on the second latch sub-circuit to finish the reading the information in the first latch sub-circuit to the SO.

(3) The data on the SO is written into the latch circuit (the first latch sub-circuit or the second latch sub-circuit).

For writing of the first latch sub-circuit, d2 is taken as an example.

Its process is: applying set_2 (a set signal), and writing the data on the SO to the first latch sub-circuit, which employs set_2 (D2=~SO).

For writing of the second latch sub-circuit, d1 is taken as an example. Its process may be as follows: first writing the data on the SO to the first latch sub-circuit, and then switching the information in the first latch sub-circuit and the second latch sub-circuit to finish the writing the data on the SO to the second latch sub-circuit.

(4) The second information in the second latch sub-circuit is passed to the first latch sub-circuit. Passing from d3 to d2 is taken as an example. Its process may be as follows: rst_2_latch+set_2 (D2=1); prech_all+prech_sel (SO=1); rd_c (SO=~D3); and rst_2 (D2=~so=D3).

The symbol "~" represents an inversion logic operation, and the symbol "=" represents an assignment operation.

Figure 12:
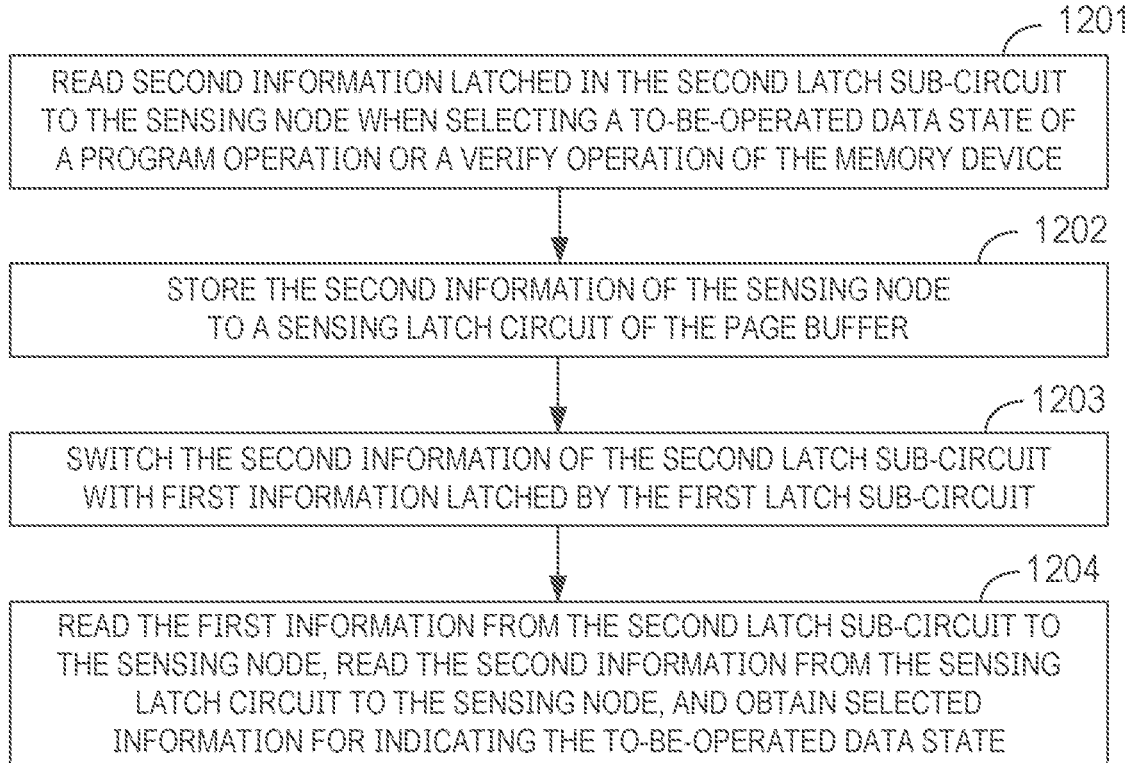
FIG. 12 is a flow diagram of an operation method of a memory device provided by examples of the present application.

During a practical application process, when the page buffers with different structures are applied in the memory device, there will be some differences in the implementation of each operation in the program process and the verify process. On this basis, the memory device described above comprises a page buffer, wherein the page buffer comprises at least two groups of latch circuits; and each group of the latch circuits comprises a first latch sub-circuit and a second latch sub-circuit that are interdependent and coupled with a sensing node. Referring to FIG. 12, examples of the present application further provide an operation method of a memory device. A process of the operation method may comprise:

1201: reading second information latched in the second latch sub-circuit to the sensing node when selecting a to-be-operated data state of a program operation or a verify operation of the memory device;

1202: storing the second information of the sensing node to a sensing latch circuit of the page buffer;

1203: switching second information in the second latch sub-circuit with first information in the first latch sub-circuit; and

1204: reading the first information from the second latch sub-circuit to the sensing node, reading the second information from the sensing latch circuit to the sensing node, and obtaining selected information for indicating the to-be-operated data state.

The operation method may comprise a program method of the memory device, which may be a program and verify method of the memory device with the structure shown in FIGS. 7 to 11 above. In the program and verify method, since there is the page buffer as shown in FIGS. 7 to 11, that is, the memory device comprises a first latch sub-circuit and a second latch sub-circuit that are interdependent, thus when involving in reading or writing of information stored by the first latch sub-circuit and the second latch sub-circuit, some variations occur in some operations, for example, during a selection operation of a data state in the program process or the verify process, there is a need to read data to the SO from the first latch sub-circuit and the second latch sub-circuit that store the to-be-written data. Since reading of the first latch sub-circuit needs to rely on the second latch sub-circuit, the switching of the information in the second latch sub-circuit and the first latch sub-circuit is involved. However, during the switching of the information in the second latch sub-circuit and the first latch sub-circuit, the data on the SO will be damaged; and therefore, the data read to the SO needs to be temporarily stored to a latch circuit not in use.

On this basis, in the examples of the present application, based on the page buffer as shown in FIGS. 10 and 11, the specific selection operation of the data state may be as follows: first reading the second information in the second latch sub-circuit to the sensing node, then storing the second information on the sensing node to a sensing latch circuit included in the page buffer, then performing the switching of the second information in the second latch sub-circuit with the first information latched by the first latch sub-circuit, and finally, reading the first information to the sensing node from the second latch sub-circuit, reading the second information to the sensing node from the sensing latch circuit, and obtaining selected information for indicating the to-be-operated data state. Then, a control logic determines the to-be-operated data state (a to-be-programmed data state or a to-be-verified data state) according to the selected information on the SO. Here, the described sensing latch circuit may comprise the aforementioned ds or d1 in FIG. 10 or 11.

In some examples, the sensing latch circuit comprises a first sensing latch circuit and a second sensing latch circuit; the to-be-operated data state comprises a to-be-programmed data state or a to-be-verified data state; and the storing the second information of the sensing node to the sensing latch circuit included in the page buffer comprises:

storing the second information of the sensing node in the second sensing latch circuit when selecting the to-be-programmed data state corresponding to the program operation of the memory device, wherein first verify information stored by the second sensing latch circuit is invalid; and storing the second information of the sensing node in the first sensing latch circuit when selecting the to-be-verified data state corresponding to the verify operation of the memory device, wherein second verify information stored by the first sensing latch circuit is invalid, wherein the first verify information and the second verify information are generated when a previous verify operation is performed on the memory device.

Here, the described second sensing latch circuit may comprise the aforementioned d1. The first sensing latch circuit may comprise the aforementioned ds, or may be referred to as a main latch circuit. The described second verify information may refer to 3BL sensing information. The described first verify information may refer to pass sensing information.

In some examples, the switching the second information in the second latch sub-circuit with the first information latched by the first latch sub-circuit comprises:

charging the sensing node such that a voltage level of the sensing node reaches a preset threshold value, so as to read the second information to the sensing node;

closing a pass channel between the first latch sub-circuit and the second latch sub-circuit for passing the first information to the second latch sub-circuit, in response to a pass control signal;

performing a clear operation on the first latch sub-circuit such that the first latch sub-circuit is recovered to an initial state; and writing the second information into the first latch sub-circuit.

The specific operations may be referred to Item (1) in the basic working principle of the first latch sub-circuit and the second latch sub-circuit.

In some examples, the operation method may further comprise:

writing the second information into the first latch sub-circuit when the second information is written into the second latch sub-circuit in the program operation or the verify operation of the memory device; and switching the first latch sub-circuit with the second latch sub-circuit, such that the second information is stored to the second latch sub-circuit.

Described here is the operation of writing the second information to the second latch sub-circuit in the program operation or the verify operation, and the specific implementation is referred to Item (3) of the basic working principle of the first latch sub-circuit and the second latch sub-circuit described above.

In order to specifically understand the impact of the page buffer provided by examples of the present application on programming and verifying, the programming and the verifying of the memory device including the aforementioned page buffer shown in FIG. 11 are taken as an example for illustration below.

Figure 13:
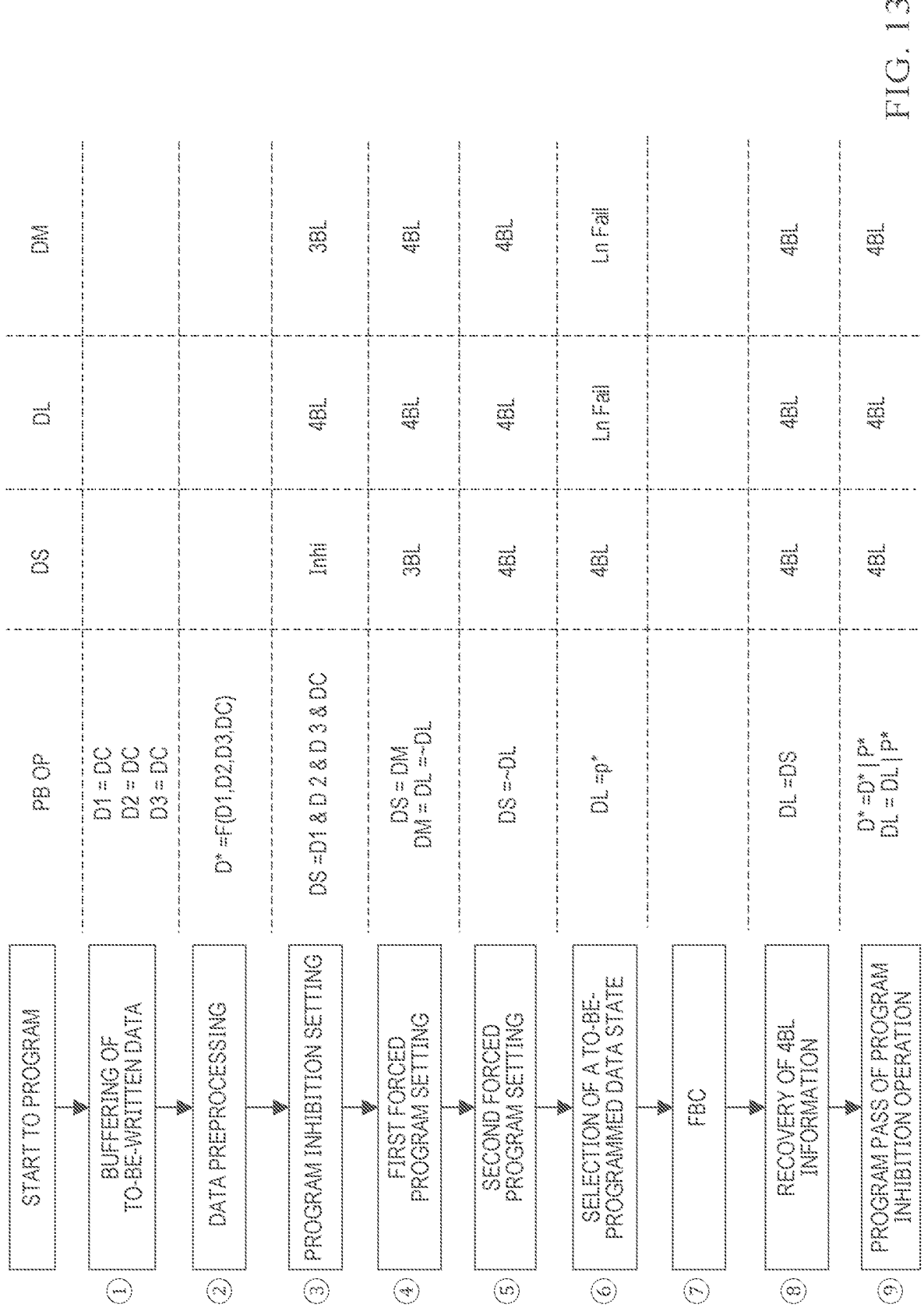
FIG. 13 is a flow diagram of a program process provided by examples of the present application.

In an example, as shown in FIG. 13, a program flow of the memory device is illustrated. The program flow comprises:

Operation 1: Buffering of to-be-written data, referring to the aforementioned operation of temporarily storing the to-be-written data for details.

Operation 2: Preprocessing of the to-be-written data, referring to the aforementioned preprocessing operation for details.

Operation 3: Program inhibition setting, i.e., applying a program inhibition bit line voltage to a program inhibition memory cell of the selected first memory cells.

Operation 4: First forced program setting, i.e., adjusting a bit line voltage of some memory cells of the selected first memory cells with first forced information to prevent over-programming.

Operation 5: Second forced program setting, i.e., adjusting a bit line voltage of some memory cells of the selected second memory cells with second forced information to prevent over-programming.

Operation 6: Selection of a to-be-programmed data state, i.e., selecting a data state to which the selected first memory cell will be programmed.

After operation 6, a program pulse corresponding to the to-be-programmed data state should be applied to the selected first memory cell, to program the memory cell to be programmed.

Operation 7: Program fail bit count (FBC), i.e., count of the number of program fails after the selected first memory cell is programmed.

Operation 8: Recovery of 4BL information.

Operation 9: Program pass of program inhibition operation, i.e., recovering all latch circuits for storing data in the page buffers corresponding to a program pass memory cell of the selected first memory cells to an initial state, for example, all storing the number "1".

In operation 1, the to-be-written data may be configured to comprise a plurality of pages of data, wherein the plurality of pages of data may be related to which type the memory cell is to be configured as. For example, if the memory cell needs to be configured as a QLC type, the plurality of pages of data may comprise Low Page (LP) data, Middle Page (MP) data, Up Page (UP) data and Extra Page (XP) data. For another example, if the memory cell needs to be configured as a TLC type, the plurality of pages of data may comprise LP data, MP data and UP data. Regardless of which type the memory cell is to be configured as, the program method is similar.

For operation 1, the plurality of groups of latch circuits comprise a first group of latch circuits and a second group of latch circuits; the to-be-written data is input from a data pass circuit that is coupled with a first latch sub-circuit in the second group of latch circuits; and the Buffering of the to-be-written data (operation 1) may comprise:

receiving LP data of the to-be-written data, and storing the LP data into the first latch sub-circuit in the second group of latch circuits;

turning off a channel between the first latch sub-circuit and a second latch sub-circuit in the second group of latch circuits;

receiving MP data of the to-be-written data, and storing the MP data into the second latch sub-circuit in the second group of latch circuits;

receiving UP data of the to-be-written data, and storing the UP data into the second latch sub-circuit in the second group of latch circuits; and receiving XP data of the to-be-written data, and storing the XP data into a first latch sub-circuit in the first group of latch circuits.

For the page buffer as shown in FIGS. 11 and 10, d1 and d2 may be an example of the second group of latch circuits, and dc and d3 may be an example of the first group of latch circuits. In the page buffer structure as shown in FIGS. 10 and 11, temporarily storing the to-be-written data may comprise: turning on pass_2+pass_c; connecting a channel between the first latch sub-circuit and the second latch sub-circuit in the first group of latch circuits, and connecting the channel between the first latch sub-circuit and the second latch sub-circuit in the second group of latch circuits, i.e., connecting d1 and d2, and connecting dc and d3; receiving, by dc, LP data from the data pass circuit, and storing the LP data into the first latch sub-circuit (d1) in the second group of latch circuits; then turning off pass_2, receiving, by dc, MP data from the data pass circuit, and storing the MP data into the second latch sub-circuit (d2) in the second group of latch circuits; then, receiving, by dc, UP data from the data pass circuit, and storing the UP data into the second latch sub-circuit (d3) in the first group of latch circuits; and receiving, by dc, XP data from the data pass circuit, and storing the XP data into the first latch sub-circuit (dc) in the first group of latch circuits.

The above process may be simplified as: the to-be-written data comprises inputs of 4 pages of data described above, the to-be-written data that is input by a user is successively input into a DC latch through a data path, and the to-be-written data successively needs to achieve D1=DC (dc receiving data and passing it to d1), D2=DC and D3=DC, wherein the operation of D1=DC may be as follows: turning on pass_2+pass_c, connecting D1/D2 and D3/DC, passing DC data into D2 and D1, and turning off pass_2. The operation of D2=DC is as follows: turning on pass_c, connecting D3/DC, and passing DC data to D2; and the operation of D3=DC is as follows: turning on pass_c, and turning off pass_c.

Here, for reading and writing of the first latch sub-circuit (d2) and the second latch sub-circuit (d1) as well as information switching therebetween, their operations may be performed according to the operations described above, which is no longer repeated here.

For operation 2, the preprocessing of the to-be-written data may comprise: preprocessing the plurality of pages of data, such that the to-be-written data is stored in the respective latch circuit according to preset coding.

The purpose of this operation is to perform transcoding processing again on the to-be-written data that has been stored in the respective latch circuit according to the preset coding, and store internal data of the respective memory device for ease of operation to facilitate the operation of the page buffer. A logic that needs to be achieved for reading the latch circuit involved in the preprocessing process is:

SO=~DS & P*, wherein P* represents the selected data state, which is the same as the selection logic described above, and may be referred to the above description, and what is stored in DS is a label that is not preprocessed in the selected data state. A logic that needs to be achieved for writing the latch circuit involved in the preprocessing process is to perform a set/rst operation on the latch circuit for storing data corresponding to the page buffer corresponding to the selected memory cell, and the purpose is to change a corresponding number in a source code to a corresponding number in an internal code, for example, from corresponding "0" in the source code to corresponding "1" in the internal code.

The memory device comprising the page buffer as shown in FIG. 11 is taken as an example for illustration. For the case that writing to the first latch sub-circuit is required, the selected information on the SO may be directly written to the latch circuit; and by taking writing 1 to D2 as an example: SO=~DS & P*, set_2 (D2=1). For the case that writing to the second latch sub-circuit is required, a switch operation needs to be performed with the first latch sub-circuit. Since there is information with preprocessing labels in DS, but DL is not used at this time, DL is used for temporarily storing the SO before the switch operation, by taking writing 0 to D1 as an example: SO passed to DL for temporary storage (DL=~DS & P*); switch D1/D2; prech_all+prech_sel (SO=1); rd_1; and rst_2 (D1=0).

For operation 3, program inhibition setting may comprise sequentially storing the plurality of pages of data to the first sensing latch circuit (i.e., ds) of the page buffer to generate program suppression information. In an example, it may be achieved by using the following operations: first, passing the LP data stored in the second latch sub-circuit in the second group of latch circuits into the main latch circuit; then passing the MP data in the first latch sub-circuit in the second group of latch circuits into the second latch sub-circuit in the second group of latch circuits; then reading the MP data to the sensing node, and storing the MP data to the main latch circuit; and then sequentially storing the UP data and the XP data to the main latch circuit to generate the program suppression information.

The above operations achieve the logic DS=D1 & D2 & D3 & DC, thereby generating the program suppression information. The program suppression information may be used to select the program inhibition memory cell, and a program inhibition bit line voltage is applied to a bit line corresponding to the program inhibition memory cell according to the program suppression information. That is, the operation of 3 is implemented. Here, for operation 3, the selected first memory cell may be selected by a control logic according to a preset program manner. For memory cells of the selected first memory cells having passed program in the previous program operation, these memory cells do not need to be programmed at this time; therefore, a respective bit line voltage is provided for the selected memory cell according to the program suppression information, wherein the bit line voltage may include a program inhibition bit line voltage (such as VDD) corresponding to the program pass memory cell of the selected memory cells and a program permit bit line voltage (such as a ground voltage) corresponding to a program unpass memory cell of the selected memory cells.

The above process is illustrated by including the page buffer shown in FIG. 11 as an example. The specific process comprises:

1. passing D1 into DS (DS=D1);
2. switching D1/D2;
3. prech_all+prech_sel (so=1);

4. rd_2 (so=~D2);

5. rst_s (DS=D1 & D2);

6. repeating operations 3-5 for D3 (DS=D1 & D2 & D3);

7. switching D3/DC; and 8. repeating operation 6 (DS=D1 & D2 & D3 & D4).

After the program suppression information is obtained, a bit line voltage is provided for the selected first memory cell in the memory device according to the program suppression information.

For operations 4 and 5, first forced program setting and second forced program setting may comprise: adjusting the bit line voltage according to first bit line forced information stored in the second sensing latch circuit included in the page buffer and second bit line forced information stored in the third sensing latch circuit.

The described second sensing latch circuit may be d1 as shown in FIG. 10 or 11. The described third sensing latch circuit may be dm as shown in FIG. 10 or 11. The described first bit line forced information may be the aforementioned 3BL sensing information, and the described second bit line forced information may be the aforementioned 4BL sensing information. According to such a programming method, the selected memory cell can be prevented from being over-programmed, thereby reducing a width of a threshold voltage distribution of a plurality of memory cells and improving the accuracy of a program operation.

During a practical application process, the described selected first memory cell may comprise a plurality of memory cells, and these memory cells may be coupled to the same word line or several word lines. In other words, a program pulse will be simultaneously applied to the word lines coupled with the selected first memory cell to perform the program operation this time. In addition, if the selected first memory cell is configured to store a plurality of data state types of a plurality of bits of data, the selected first memory cell needs to apply multiple program pulses for finishing the program, so as to finish the program of each data state step by step. Therefore, before the program pulse is applied to the word line coupled with the selected first memory cell, there is a need to first select a corresponding to-be-programmed state, that is, to select a to-be-programmed data state, so as to apply a respective program pulse.

For operation 6, the selection of the to-be-programmed data state may comprise: reading one or more selected pages of the plurality of pages of data to the sensing node according to a preset logic, so as to generate selection operation information, and the specific operations may comprise: selecting a first page of data to be used from the plurality of pages of data according to the preset logic;

if the first page of data is stored in the first latch sub-circuit, temporarily storing the data on the sensing node to the first sensing latch circuit or the second sensing latch circuit of the page buffer; passing the first page of data to the second latch sub-circuit associated with the first latch sub-circuit; reading the first page of data to the sensing node, wherein the data in the first sensing latch circuit or the second sensing latch circuit is invalid data; and if the first page of data is stored in the second latch sub-circuit, directly reading the first page of data to the sensing node, wherein the first page of data includes one of the LP data, the MP data, the UP data and the XP data.

Here, the described preset logic may refer to a logic algorithm of how to obtain a to-be-programmed data state that has been designed before programming. For example, the type of the selected memory cell is a QLC, which comprises 16 data states (sequentially P0, P1, P2, . . . , P15, respectively), and selecting some data state may be achieved by selecting all "0" of program data corresponding to the to-be-written data, then for example, the logic for selecting the P1 state is SO=~D1 &~D2 &~D3 &~DC; the logic to be achieved for selecting P3 is SO=~D1 &~D3 &~DC; the logic to be achieved for selecting P7 is SO=~D1 &~D2; and the logic to be achieved for selecting P15 is SO=~D3.

Here, the described second sensing latch circuit may be, for example, d1 included in the page buffer as shown in FIG. 11. The described first sensing latch circuit may be ds included in the page buffer as shown in FIG. 11. According to the above description of reading the information stored by the first latch sub-circuit to the SO, there is a need to be converted into reading the information in the second latch sub-circuit. Since the data that has been read in the SO will be damaged in this process, before switching the information in the first latch sub-circuit and the second latch sub-circuit, the data on the SO is now temporarily stored into some latch circuit to prevent loss of the data on the SO. For example, during a selection operation of a to-be-programmed data state in a program process, the first sensing latch circuit stores the 4BL sensing information, but the data in d1 is useless (i.e., invalid data), and d1 may be used to temporarily store the data on the SO. For another example, during a selection operation of a data state in a program pass of program inhibition operation in a program process, the data in the first sensing latch circuit is useless (invalid data), and DS may be used to temporarily store the SO data. For yet another example, for selection of a to-be-verified data state in a verify process and selection of a program pass memory cell, DS may be also used to temporarily store the SO data. That is, in response to the latch circuit storing the first page of data being the first latch sub-circuit, the data on the sensing node is temporarily stored to the first sensing latch circuit or the second sensing latch circuit of the page buffer; the first page of data is passed to the second latch sub-circuit associated with the first latch sub-circuit; and the first page of data is read to the sensing node. When the first page of data is stored in the second latch sub-circuit, the stored information may be directly read to the SO.

The first page of data here may comprise one or more of the plurality of pages of data. When the first page of data comprises one page, one operation is performed according to the above method. However, when the first page of data comprises a plurality of pages, a plurality of operations are performed according to the above method, so as to read all the pages of data involved to the SO, perform computation on the SO according to a certain logic, generate selection operation information or other selection operation information, and achieve selection of the to-be-programmed data state.

An implementation process in the specific circuit is illustrated by taking the aforementioned page buffer shown in FIG. 11 as an example. By taking the selection of the to-be-programmed data state P1 in the program process as an example, the specific operation process may be as follows: rst_sa_latch+set_1 (DL=1); prech_all+prech_sel (so=1); rd_2+rd_c (so=~D1 &~D3); rst_1 (DL=~(~D1 &~D3)); switch D1/D2; switch D3/DC (D1=D2, D3=DC); and rd_1, rd_2, rd_c (so=~D1 &~D2 &~D3 &~DC).

For another example, by taking a selection operation of the data state P1 in the program pass of program inhibition operation in the program process as an example, the specific operation process may be as follows: rst_sa_latch+set_s (DS=1); prech_all+prech_sel (so=1); rd_2+rd_c (so=~D1

&~D3); rst_s (DS=~(~D1 &~D3)); switch D1/D2, switch D3/DC (D1=D2, D3=DC); and rd_s, rd_2, rd_c (so=~D1 &~D2 &~D3&~DC).

For yet another example, the specific operation of the selection of the program pass memory cell (in the P1 state) in the verify process may be as follows: prech_all+prech_sel (SO=1); rd_s+rd_2+rd_c (so=~DS &~D1 &~D3); rst_sa_latch+set_s (DS=1); rst_s (DS=~(~DS &~D1 &~D3)); switch D1/D2, switch D3/DC (D1=D2, D3=DC); and rd_s, rd_2, rd_c (SO=~DS &~D1 &~D2 &~D3 &~DC).

The operation in 7 and 8 not involving the latch circuit in the page buffer in the examples of the present application is no longer repeated here.

Referring to FIG. 14, a specific flow diagram of a verify process is illustrated.

In FIG. 14, the verify process may comprise:

Operation 1. Starting to verify and selecting a Pn program state. Supposing that a verify Pn state is entered after the end of Pn-1 verify, a selected program state operation DS=P* is performed, wherein P* performs an operation of the selected Pn program state according to data in D1/D2/D3/DC.

Operation 2. 3BL sensing; here, prior to 3BL sensing, the SO corresponding to a first memory cell and a second memory cell is precharged and the SO is precharged to a preset initial voltage. During the 3BL sensing, first verify information is latched to the first sensing latch circuit d1. The SO is precharged using the data of DS (DS=P*), then develop discharge is performed on the SO, soblk and sodisch are turned off to stop develop after the develop time of t_sodev_3bl, and then rst_1 is turned on to store the 3BL sensing information into DL (DL=DL &~SO). The symbol "&" represents logical AND, and the symbol "~" represents logical NOT.

Operation 3. Switching DL/DM. The 3BL sensing information is passed to DL/DM.

Operation 4. 4BL sensing, i.e., DL=~SO. Here, based on the 3BL sensing, the SO continues to discharge for a period of time (such as a second preset duration), and then second verify information (i.e., 4BL sensing information) is latched to the first sensing latch circuit DL.

Operation 5. Pass sensing; here, based on the 4BL sensing, the SO continues to discharge for a period of time (such as a third preset duration), and then third verify information (i.e., pass sensing information) is latched to the main latch circuit DS. A specific circuit operation description is as follows: turning on soblk and sodisch, turning off soblk and sodisch to stop develop after the develop time of t_sodev_Pass, clearing DS data to prepare for Pass sensing (DS=1); and turning on rst_s to sense Pass data into DS (DS=~SO), wherein 4BL' data on the SO will be cleared by DS since sodisch is turned on in the develop process.

Operation 6. Program inhibition of a Pass memory cell; here, different bit line voltages are applied to a bit line coupled with the first memory cell according to the first verify information, the second verify information and the third verify information, wherein the memory cell that passes the verify is inhibited from program (applying a program inhibition bit line voltage to a third bit line connected with the third groups of memory cells). The data of D1/D2/D3/DC in a Pn state is inhibited using Pass data in DS, i.e., writing as 1, that is, D*=~DS&P*.

Operation 7. Judging whether it is a final program state.

Operation 8. If not, switching DL/DM. This operation switches data in DL/DM in conjunction with the circuit description of FIG. 17 below, wherein after switching, what is in DL is the 3BL sensing information and what is in DM is the 4BL sensing information. Then it enters a Pn+1 state verify operation, which is similar to the above description.

Operation 9. If yes, ending the verification. Pn+1 is the last verify program state; and therefore, verify recovery is directly entered after the end, so as to end a verify sequence.

The selection operation of the data state is also involved in the verify process, which is similar to the program process, that is: the specific process may comprise: reading one or more selected pages of the plurality of pages of data to the sensing node according to the preset logic, so as to generate selection operation information for indicating a to-be-verified data state, wherein the second selection operation information is used to select the second memory cell in the to-be-verified date state; and then, storing first verify information, second verify information and third verify information respectively to the first sensing latch circuit, the second sensing latch circuit and the third sensing latch circuit that are included in the memory device according to three different voltage levels of the sensing node corresponding to the second memory cell, wherein the first verify information, the second verify information and the third verify information are used to verify a program result of the second memory cell.

The preset logic here has the same meaning as the preset logic during the previous program, which is no longer repeated here. Here, it may be a verify operation for the memory cell after the programming. The first sensing latch circuit described here may be ds as shown in FIG. 10 or 11, and the described second sensing latch circuit may be d1 as shown in FIG. 10 or 11. The described third sensing latch circuit may be dm as shown in FIG. 10 or 11. The described first verify information may be the aforementioned pass sensing information. The second verify information may be the aforementioned 3BL sensing information. The described third verify information may refer to a verify result obtained by 4BL sensing in a verify operation by a 4BL BIAS programming method.

When the page buffer shown in FIG. 11 is used to perform programming or verifying, two groups of latch circuits for storing the to-be-written data comprise a first latch sub-circuit and a second latch sub-circuit that are interdependent, such that some operations of reading the latch circuit and writing to the latch circuit in some operations in the program process and the verify process shown in FIGS. 14 and 15 have some changes. For example, the operations of reading the latch circuit in the program process shown in FIG. 14 and the verify process shown in FIG. 15 comprise: Buffering of the to-be-written data (operation 1 of the program process), selection of a data state (operations 6 and 9 in the program process, and operation 1 in the verify process), and program inhibition setting (operation 3 in the program process). The operations of writing to the latch circuit comprise: Buffering of the to-be-written data (operation 1 of the program process), data preprocessing (operation 2 in the program process), program pass inhibit setting (operation 9 in the program process and operation 6 in the verify process), etc. The aforementioned operations involved in each step have been described in detail, which is no longer repeated here.

Examples of the present application provide the page buffer as shown in FIGS. 10 and 11, and the latch circuit is arranged into several groups of interdependent latch circuits (a first latch sub-circuit and a second latch sub-circuit), such that the area of the page buffer can be reduced, and the cost of manufacturing the memory device is largely saved.

Examples of the present application further provide a memory system, comprising: one or more memory devices described above, and a memory controller coupled with the memory devices and configured to control the memory devices.

Examples of the present application further provide an electronic system, comprising: the aforementioned memory system and a host coupled with the memory system.

The memory system and the electronic system provided by the examples of the present application comprise the aforementioned memory and have the same technical features, and the structure of the memory and the terms appearing in the technical solution involved in the present application have been described in detail above, so the terms appearing here can be understood according to the meanings described above, which is no longer repeated here.

The above descriptions are intended to be illustrative, and not restrictive. For example, the above-mentioned examples (or one or more aspects thereof) may be combined with each other for use. Other examples may be used, for example, those that can be used when those of ordinary skill in the art read the above description. It will not be used to explain or limit the scope or meaning of the claims. In addition, in the above detailed description, various features may be combined together to simplify the present application. This should not be construed to mean that the disclosed features that are not claimed are necessary for any claim. Instead, the subject matter of the disclosure may be less than all features of a particular disclosed example. Thus, the appended claims are hereby incorporated into the detailed description, with each claim standing on its own as a separate example, and it is expected that these examples can be combined with each other in various combinations or replacements. The scope of the present application should be determined with reference to the appended claims, along with the full scope of equivalents to which such claims are entitled.

What is claimed is:

1. A memory device, comprising:
a memory array comprising a plurality of memory cells; and
a peripheral circuit coupled with the memory array and comprising a plurality of page buffers, each page buffer comprising at least two groups of latch circuits, and each group of latch circuits comprising a first latch sub-circuit and a second latch sub-circuit, wherein
the first latch sub-circuit is coupled with a sensing node and configured to latch first information on the sensing node; and
the second latch sub-circuit is coupled with the sensing node and configured to latch second information on the sensing node through the first latch sub-circuit;
wherein the first information in the first latch sub-circuit and the second information in the second latch sub-circuit are switched through the sensing node,
wherein each group of latch circuits further comprises a pass control switch,
wherein the pass control switch connects the first latch sub-circuit with the second latch sub-circuit, and is configured to be in a turned-on state to pass the first information stored in the first latch sub-circuit to the second latch sub-circuit in response to a pass control signal.

2. The memory device of claim 1, wherein the second latch sub-circuit comprises a parasitic capacitor for storing the second information, wherein the parasitic capacitor is connected with an end of the pass control switch away from the first latch sub-circuit.

3. The memory device of claim 1, wherein the pass control switch comprises one of a pass gate of a single MOS transistor structure or a pass gate of a double MOS transistor structure, wherein the double MOS transistor structure comprises a CMOS pass gate formed by connecting a PMOS transistor and an NMOS transistor in parallel.

4. The memory device of claim 1, wherein the at least two groups of latch circuits are configured to store one of to-be-written data or read data.

5. The memory device of claim 4, wherein the at least two groups of latch circuits comprise: two groups of latch circuits that are configured to store Low Page (LP) data, Middle Page (MP) data, Up Page (UP) data and Extra Page (XP) data of one of to-be-written data or read data.

6. The memory device of claim 1, wherein one group of the at least two groups of latch circuits is configured to store intermediate data in a program process and verify data in a verify process; and
other groups of the at least two groups of latch circuits are configured to store to-be-written data or read data.

7. The memory device of claim 6, wherein the at least two groups of latch circuits comprise: three groups of latch circuits, wherein
two groups of latch circuits are configured to store Low Page (LP) data, Middle Page (MP) data, Up Page (UP) data and Extra Page (XP) data of one of to-be-written data or read data; and
the remaining group of latch circuits is configured to store intermediate data in a program process and verify data in a verify process.

8. The memory device of claim 1, wherein the first latch sub-circuit comprises a set switch and a storage element, wherein
the set switch is coupled with the sensing node and connected with the storage element, and is configured to latch the first information on the sensing node to the storage element in response to a set signal.

9. The memory device of claim 8, wherein the first latch sub-circuit further comprises a reset switch that is connected with the storage element, and configured to reset the storage element in response to a reset signal.

10. The memory device of claim 9, wherein the first latch sub-circuit further comprises a sensing control switch with one end connected to the set switch and the reset switch, and with the other end being grounded; and
the sensing control switch is configured to be turned on under a voltage level of the sensing node and write the first information of the sensing node to the storage element through the set switch.

11. The memory device of claim 9, wherein the first latch sub-circuit further comprises a reset control switch with one end connected to the set switch and the reset switch, and with the other end being grounded; and
the reset control switch is further configured to reset the first latch sub-circuit through the reset switch in response to a reset control signal,
wherein the reset control signal is generated by control of a control logic included in the peripheral circuit.

12. The memory device of claim 11, wherein at least one of the page buffers comprises: a main latch circuit coupled with the sensing node and configured to store intermediate data in a program process and verify data in a verify process,
wherein a structure of the main latch circuit is the same as a structure of the first latch sub-circuit.

13. The memory device of claim 9, wherein the storage element comprises a first phase inverter and a second phase inverter, wherein an input end of the first phase inverter is connected with an output end of the second phase inverter to form a first node; an output end of the first phase inverter is connected with an input end of the second phase inverter to form a second node; and the second node is connected with the second latch sub-circuit, and is configured to store the first information.

14. The memory device of claim 13, wherein the set switch comprises a first transistor with one end connected to the first node; and the reset switch comprises a second transistor with one end connected to the second node, wherein the other end of the first transistor is connected with the other end of the second transistor.

15. The memory device of claim 1, wherein each group of latch circuits further comprises a first control switch and a second control switch that are connected in series between the sensing node and ground, the first control switch is controlled by the second information latched by the second latch sub-circuit, and the second control switch is controlled by a read control signal, wherein when the second information controls the first control switch to be turned on and the read control signal controls the second control switch to be turned on, the second information is read to the sensing node.

16. An operation method of a memory device, wherein the memory device comprises a page buffer; the page buffer comprises at least two groups of latch circuits; each group of latch circuits comprises a first latch sub-circuit and a second latch sub-circuit that are interdependent and coupled with a sensing node; and the operation method comprises:

reading second information latched in the second latch sub-circuit to the sensing node when selecting a to-be-operated data state of a program operation or a verify operation of the memory device;

storing the second information of the sensing node to a sensing latch circuit of the page buffer;

switching the second information in the second latch sub-circuit with first information latched by the first latch sub-circuit; and reading the first information from the second latch sub-circuit to the sensing node, reading the second information from the sensing latch circuit to the sensing node, and obtaining selected information for indicating the to-be-operated data state.

17. The operation method of claim 16, wherein the sensing latch circuit comprises a first sensing latch circuit and a second sensing latch circuit; the to-be-operated data state comprises a to-be-programmed data state or a to-be-verified data state; and the storing the second information of the sensing node to the sensing latch circuit included in the page buffer comprises:

storing the second information of the sensing node in the second sensing latch circuit when selecting the to-be-programmed data state corresponding to the program operation of the memory device, wherein first verify information stored by the second sensing latch circuit is invalid; and storing the second information of the sensing node in the first sensing latch circuit when selecting the to-be-verified data state corresponding to the verify operation of the memory device, wherein second verify information stored by the first sensing latch circuit is invalid, wherein the first verify information and the second verify information are generated when a previous verify operation is performed on the memory device.

18. The operation method of claim 16, wherein the switching the second information in the second latch sub-circuit with the first information latched by the first latch sub-circuit comprises:

charging the sensing node such that a voltage level of the sensing node reaches a preset threshold value, so as to read the second information to the sensing node;

closing a pass channel between the first latch sub-circuit and the second latch sub-circuit for passing the first information to the second latch sub-circuit, in response to a pass control signal;

performing a clear operation on the first latch sub-circuit such that the first latch sub-circuit is recovered to an initial state; and writing the second information into the first latch sub-circuit.

19. A memory system, comprising:

one or more memory devices, each comprising:

a memory array comprising a plurality of memory cells; and a peripheral circuit coupled with the memory array and comprising a plurality of page buffers, each page buffer comprising at least two groups of latch circuits, and each group of latch circuits comprising a first latch sub-circuit and a second latch sub-circuit, wherein the first latch sub-circuit is coupled with a sensing node and configured to latch first information on the sensing node; and the second latch sub-circuit is coupled with the sensing node and configured to latch second information on the sensing node through the first latch sub-circuit;

wherein the first information in the first latch sub-circuit and the second information in the second latch sub-circuit are switched through the sensing node, wherein each group of latch circuits further comprises a pass control switch, and wherein the pass control switch connects the first latch sub-circuit with the second latch sub-circuit, and is configured to be in a turned-on state to pass the first information stored in the first latch sub-circuit to the second latch sub-circuit in response to a pass control signal; and a memory controller coupled with the memory devices and configured to control the memory devices.

20. The memory system of claim 19, wherein each group of latch circuits further comprises a first control switch and a second control switch that are connected in series between the sensing node and ground, the first control switch is controlled by the second information latched by the second latch sub-circuit, and the second control switch is controlled by a read control signal, wherein when the second information controls the first control switch to be turned on and the read control signal controls the second control switch to be turned on, the second information is read to the sensing node.

* * * * *